US012593503B2

(12) United States Patent
Harada

(10) Patent No.: US 12,593,503 B2
(45) Date of Patent: Mar. 31, 2026

(54) PILLAR-SHAPED SEMICONDUCTOR DEVICE AND METHOD FOR PRODUCING THE SAME

(71) Applicant: Unisantis Electronics Singapore Pte. Ltd., Singapore (SG)

(72) Inventor: Nozomu Harada, Tokyo (JP)

(73) Assignee: UNISANTIS ELECTRONICS SINGAPORE PTE. LTD., Singapore (SG)

( * ) Notice: Subject to any disclaimer, the term of this patent is extended or adjusted under 35 U.S.C. 154(b) by 486 days.

(21) Appl. No.: 18/184,478

(22) Filed: Mar. 15, 2023

(65) Prior Publication Data

US 2023/0260995 A1 Aug. 17, 2023

Related U.S. Application Data

(63) Continuation of application No. PCT/JP2020/035235, filed on Sep. 17, 2020.

(51) Int. Cl.
H10D 84/83 (2025.01)
H10D 30/01 (2025.01)
(Continued)

(52) U.S. Cl.
CPC .......... H10D 84/83 (2025.01); H10D 30/014 (2025.01); H10D 30/43 (2025.01); (Continued)

(58) Field of Classification Search
CPC ... H10D 30/6735; H10D 84/83; H10D 62/122
See application file for complete search history.

(56) References Cited

U.S. PATENT DOCUMENTS

2015/0123193 A1 5/2015 Masuoka et al.
2016/0005764 A1* 1/2016 Masuoka ............. H10D 86/201
257/329
(Continued)

FOREIGN PATENT DOCUMENTS

JP 02-188966 A 7/1990
JP 2008-140996 A 6/2008
(Continued)

OTHER PUBLICATIONS

Notification of Transmittal of Translation of the International Preliminary Report on Patentability and Translation of Written Opinion of the International Searchino Authority in PCT/JP2020/035235, dated Mar. 30, 2023 (5 pages).
(Continued)

*Primary Examiner* — Davienne N Monbleau
*Assistant Examiner* — Emily Farmer
(74) *Attorney, Agent, or Firm* — Crowell & Moring LLP

(57) ABSTRACT

An N+ layer and a P+ layer that are impurity regions at a bottom portion are formed using as etching masks top first mask material layers and SiN layers surrounding Si pillars and formed in a self-aligned manner with respect to the Si pillars and a SiO2 layer. Then, a SiO2 layer is formed that has an upper surface located at the level of the bottom portions of the N+ layer and the P+ layer. Then, a W layer is selectively formed on exposed side faces of the N+ layer and the P+ layer. Then, a contact hole for connection to a wire metal layer is formed above the W layer as seen in plan view.

6 Claims, 21 Drawing Sheets

(51) Int. Cl.

| | | |
|---|---|---|
| *H10D 30/43* | (2025.01) | |
| *H10D 30/67* | (2025.01) | |
| *H10D 62/10* | (2025.01) | |
| *H10D 84/01* | (2026.01) | |
| *H10D 84/03* | (2025.01) | |

(52) U.S. Cl.
  CPC ..... *H10D 30/6735* (2025.01); *H10D 30/6757* (2025.01); *H10D 62/121* (2025.01); *H10D 84/0128* (2025.01); *H10D 84/013* (2025.01); *H10D 84/038* (2025.01)

(56) References Cited

U.S. PATENT DOCUMENTS

| | | | |
|---|---|---|---|
| 2019/0157426 A1* | 5/2019 | Masuoka | ........... H01L 21/3081 |
| 2020/0020812 A1 | 1/2020 | Masuoka et al. | |

FOREIGN PATENT DOCUMENTS

| | | |
|---|---|---|
| WO | WO 2015/068226 A1 | 5/2015 |
| WO | WO 2018/179026 A1 | 10/2018 |

OTHER PUBLICATIONS

Takato, Hiroshi, et al. "Impact of Surrounding Gate Transistor (SGT) For Ultra-High-Density LSI's" *IEEE Transactions on Electron Devices*, vol. 38, No. 3, pp. 573-578, Mar. 1991 (6 pages).

* cited by examiner

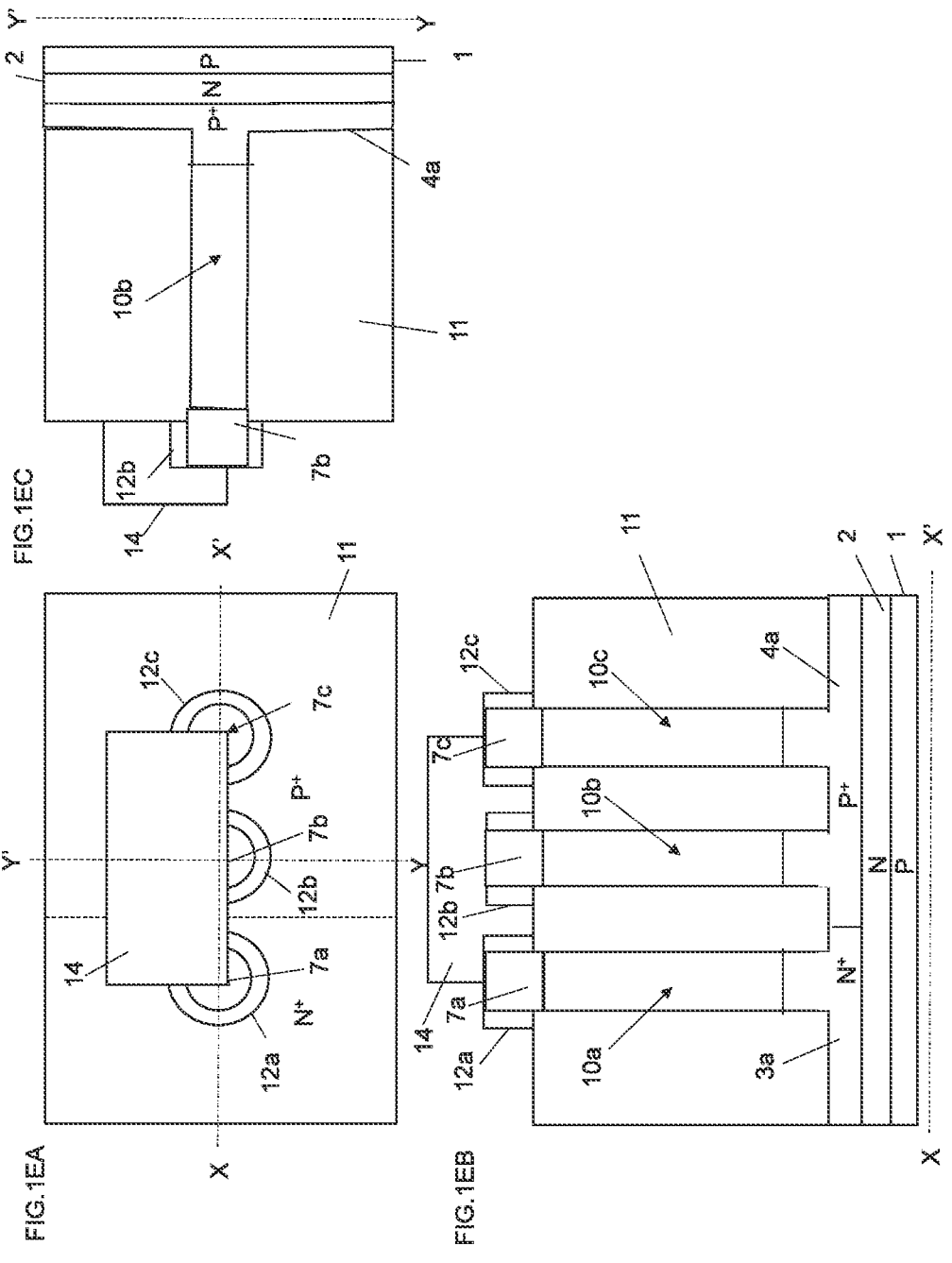

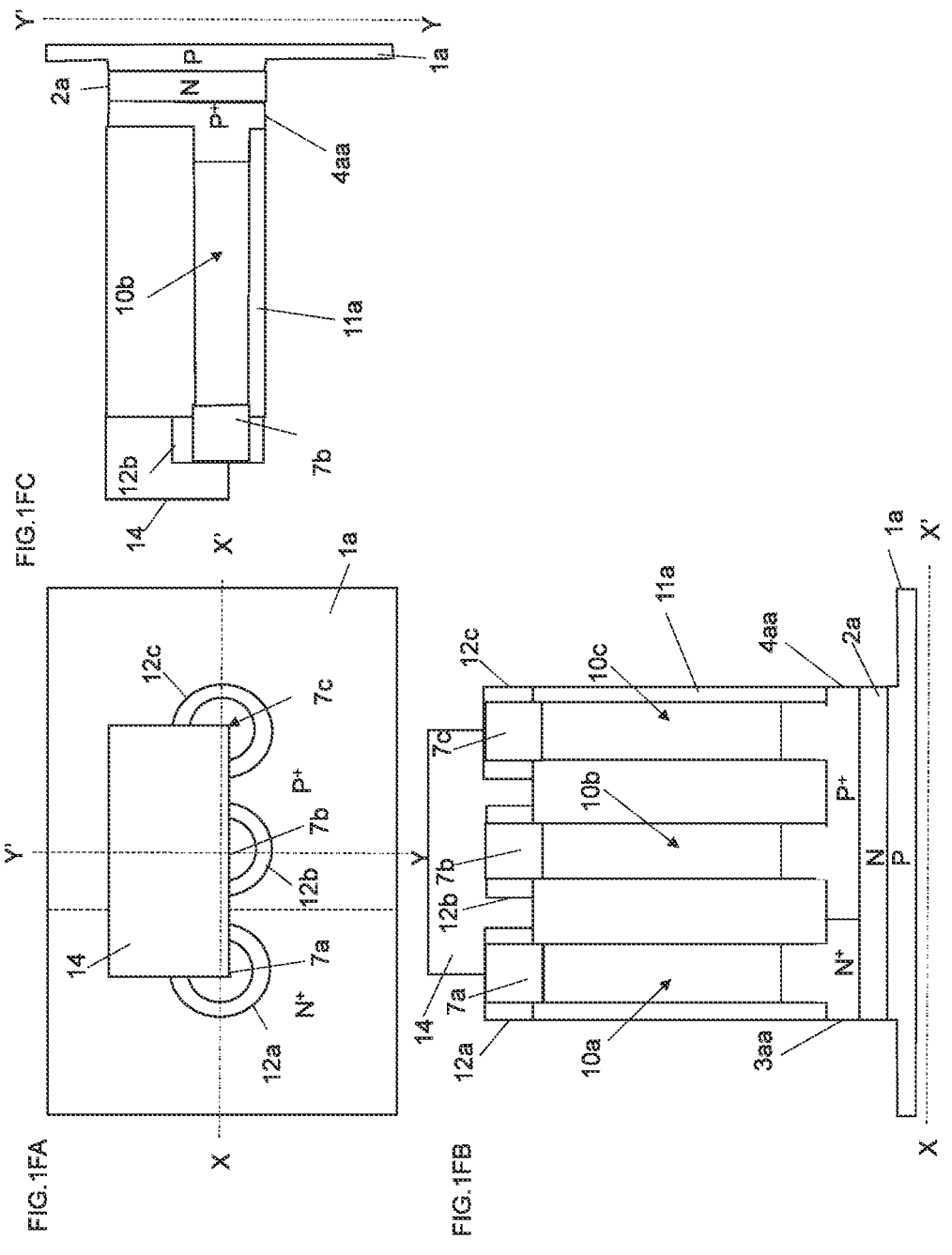

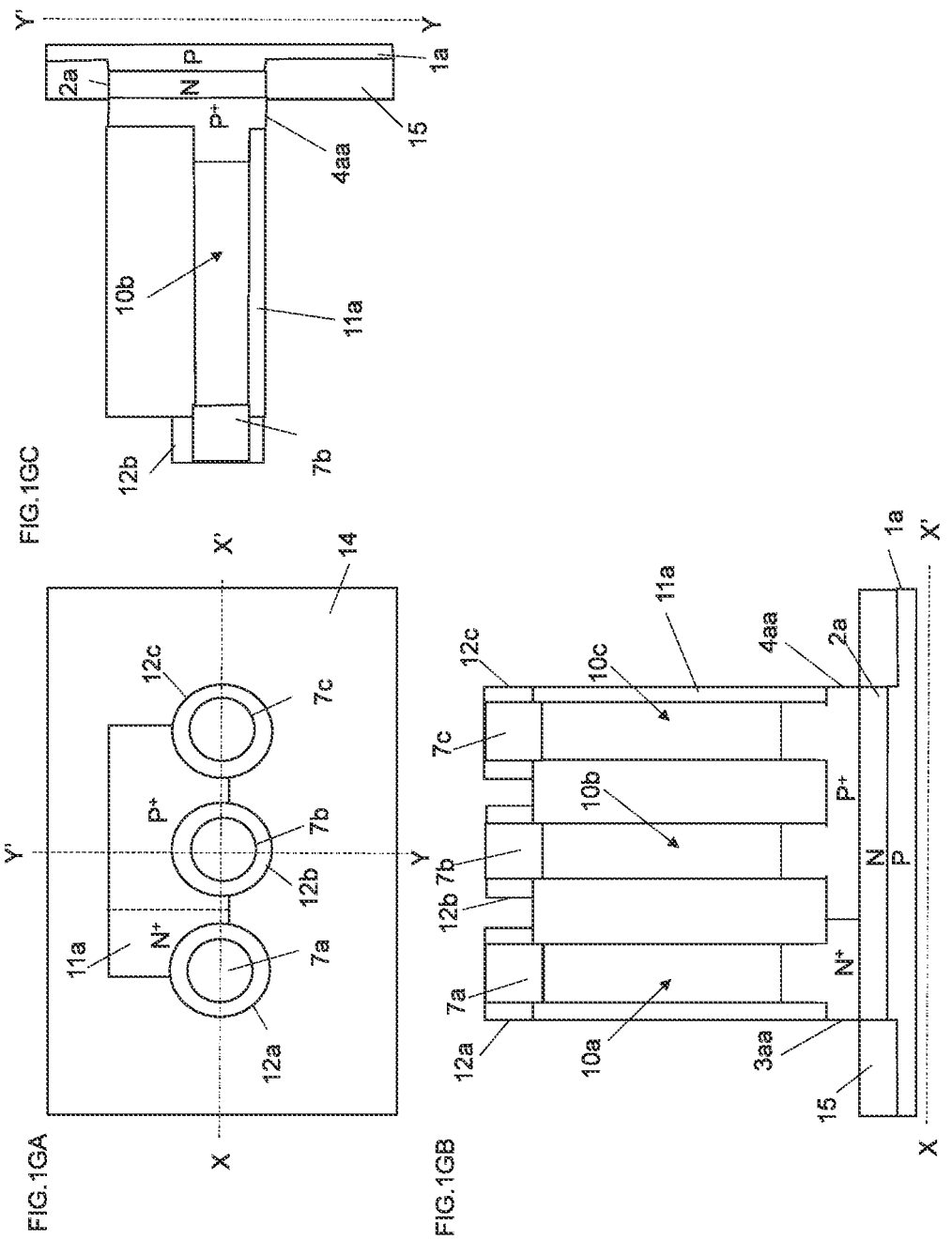

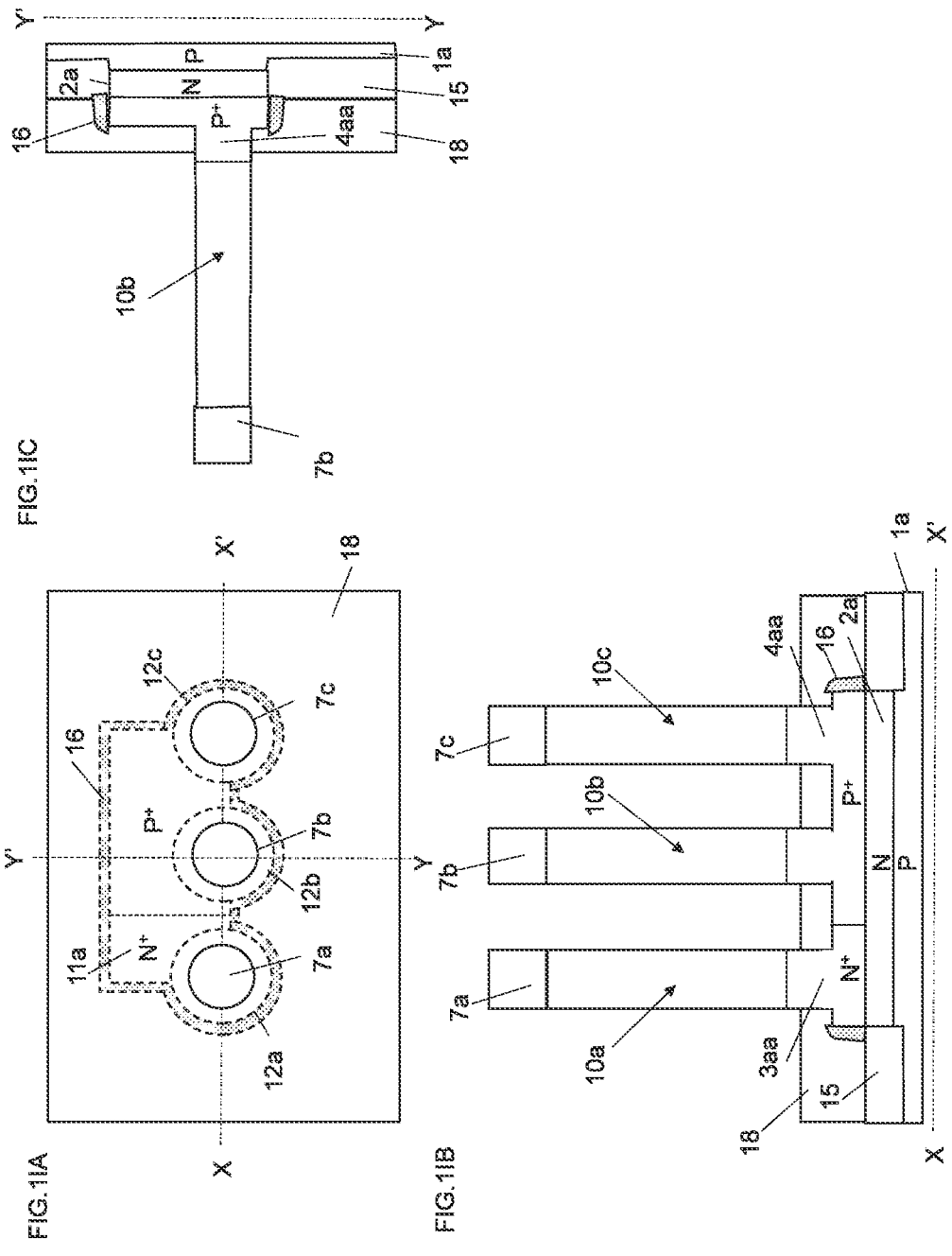

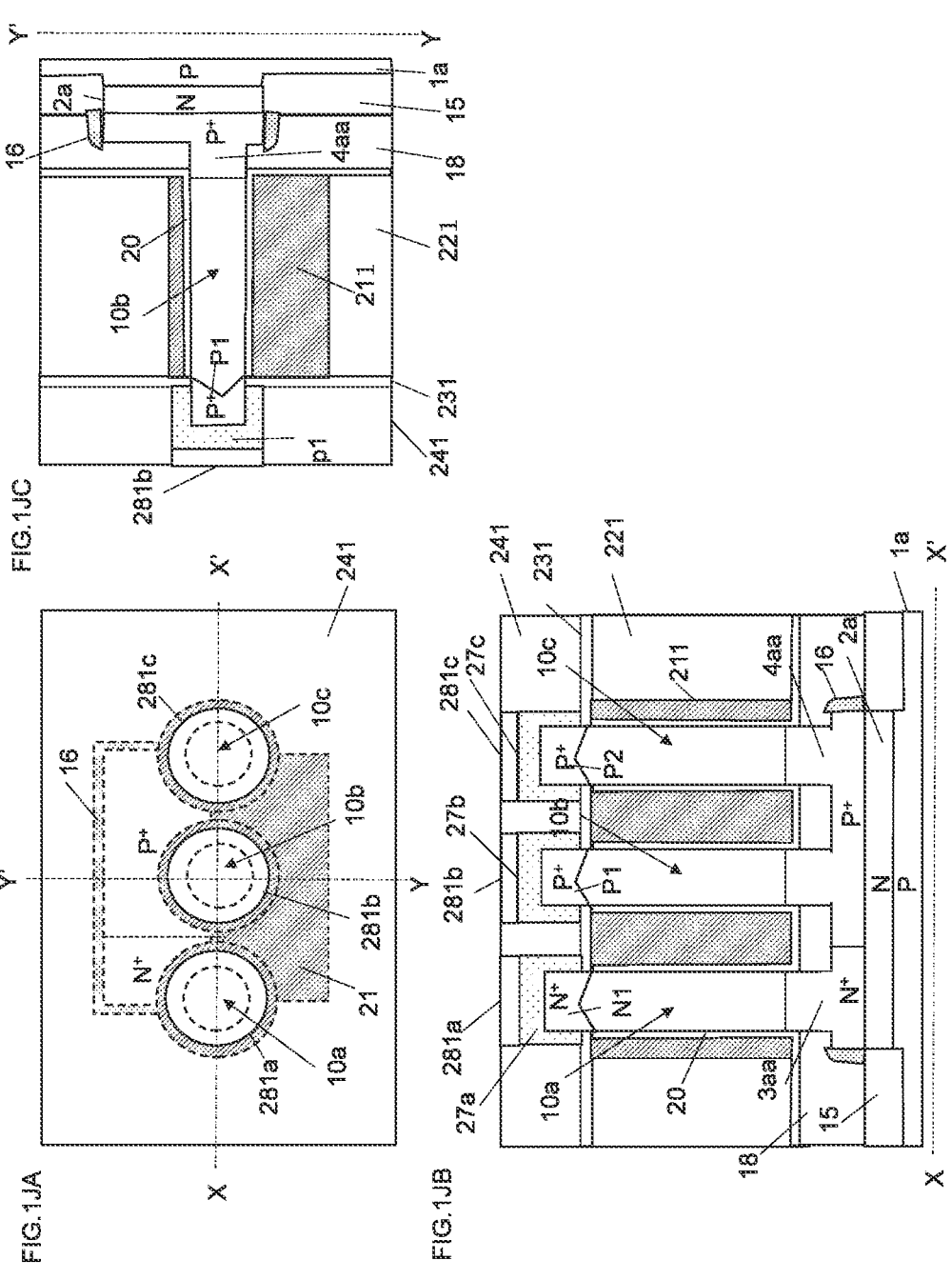

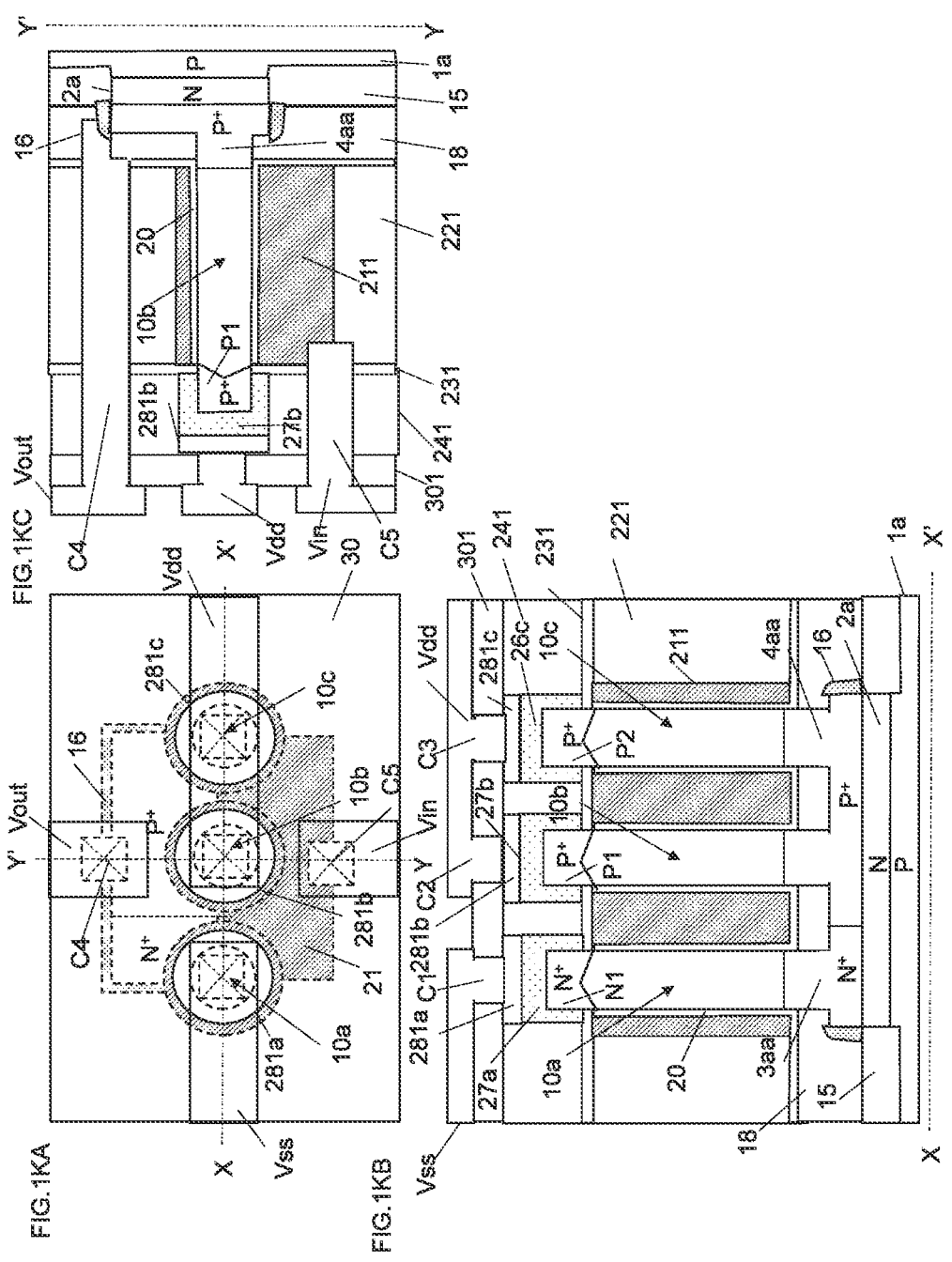

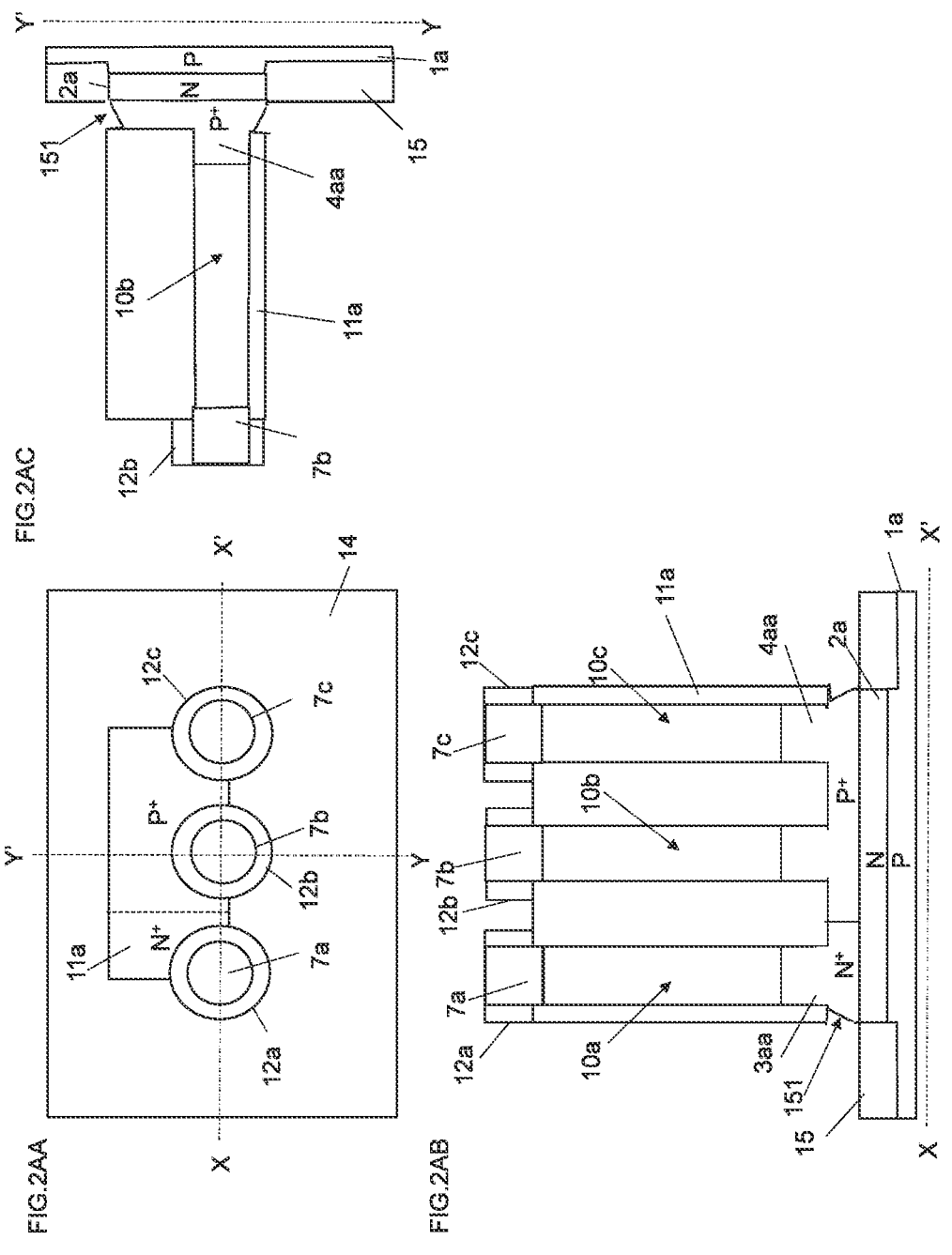

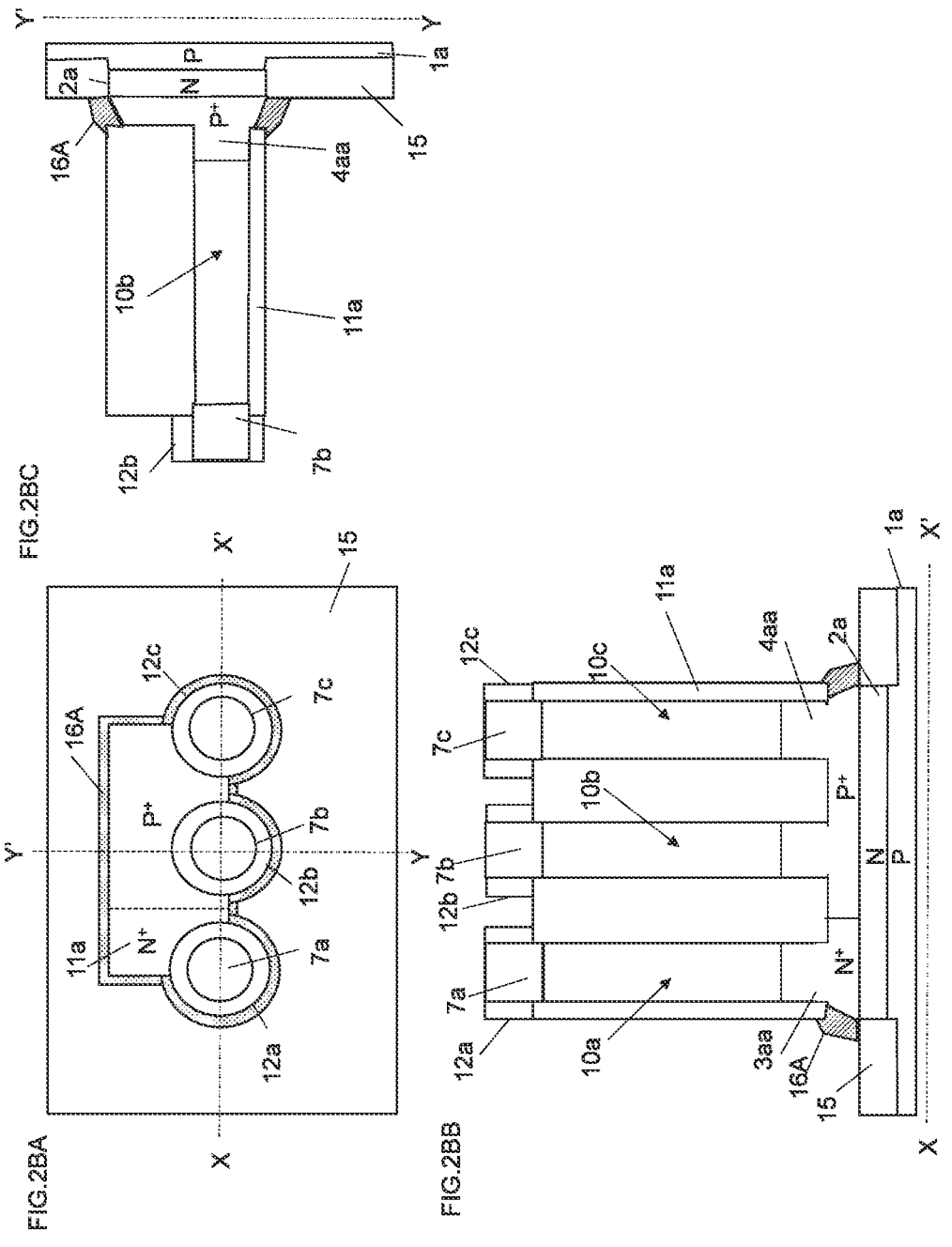

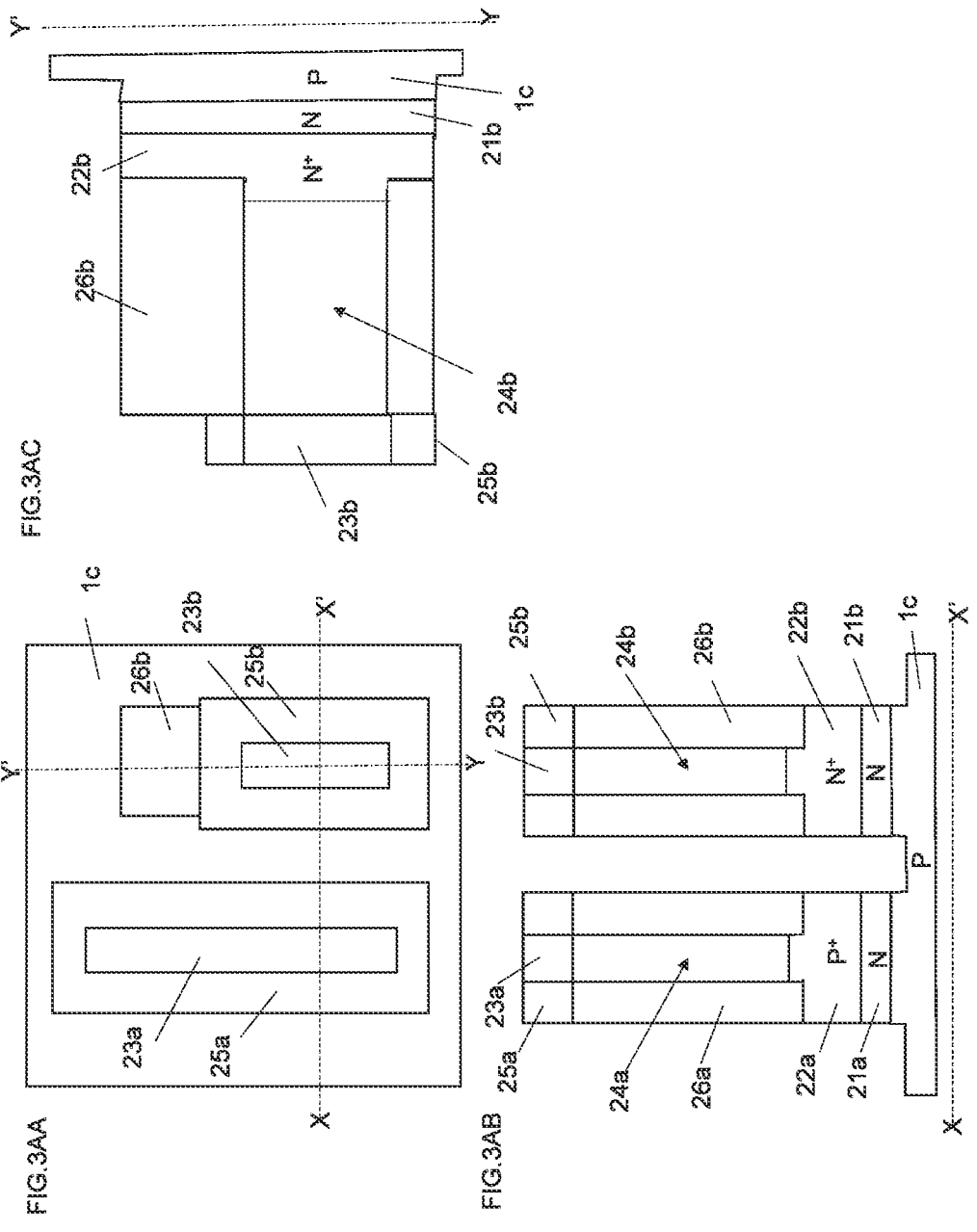

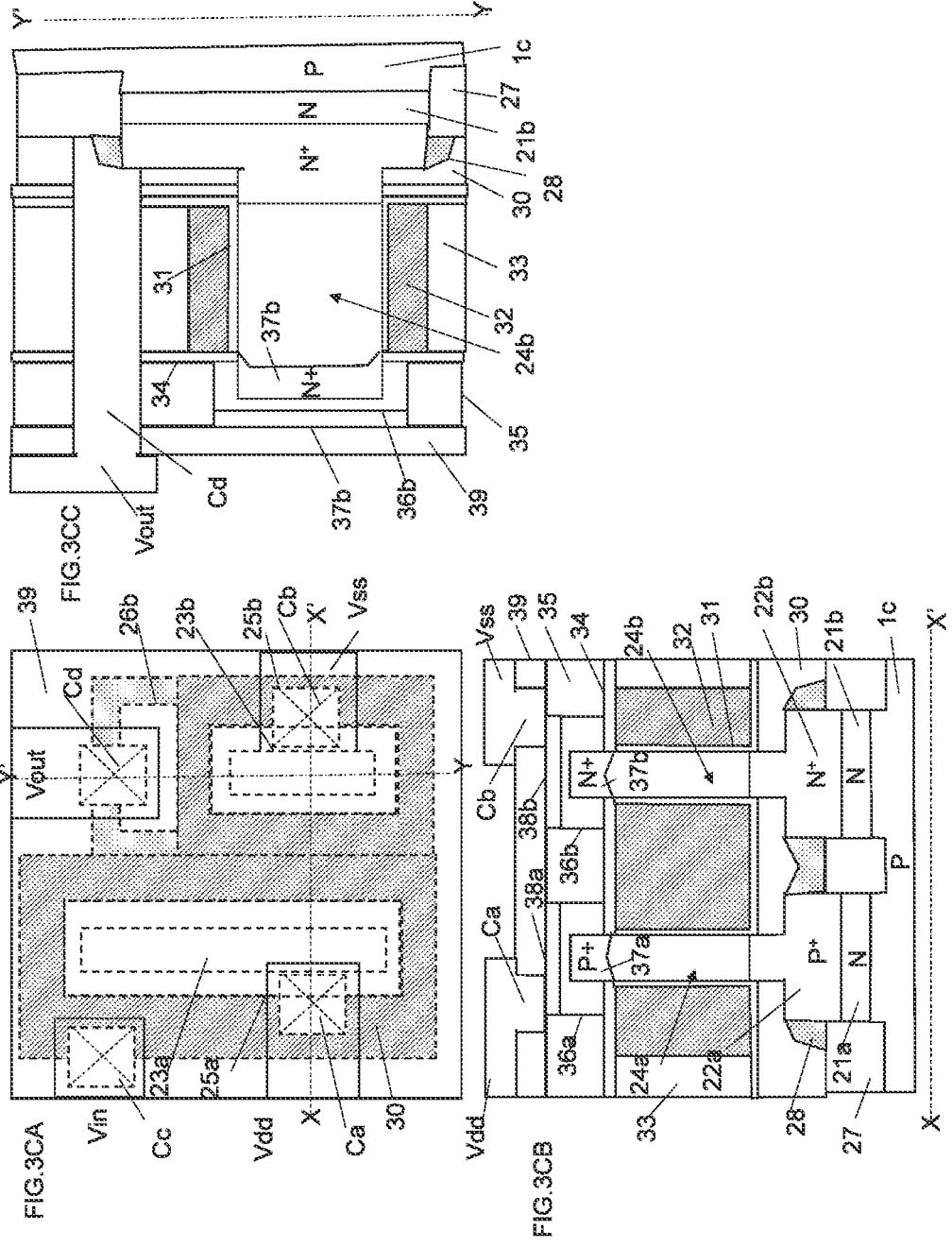

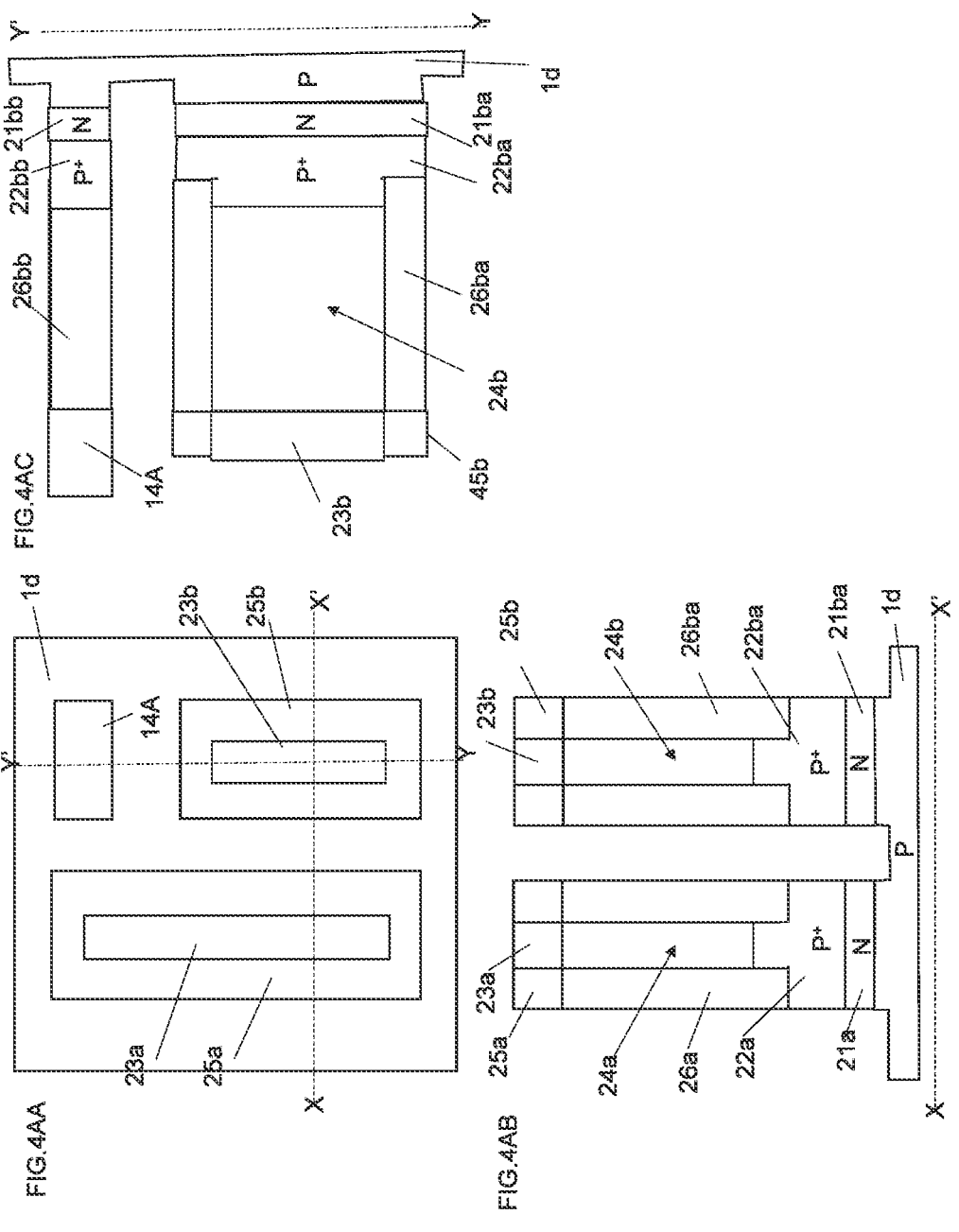

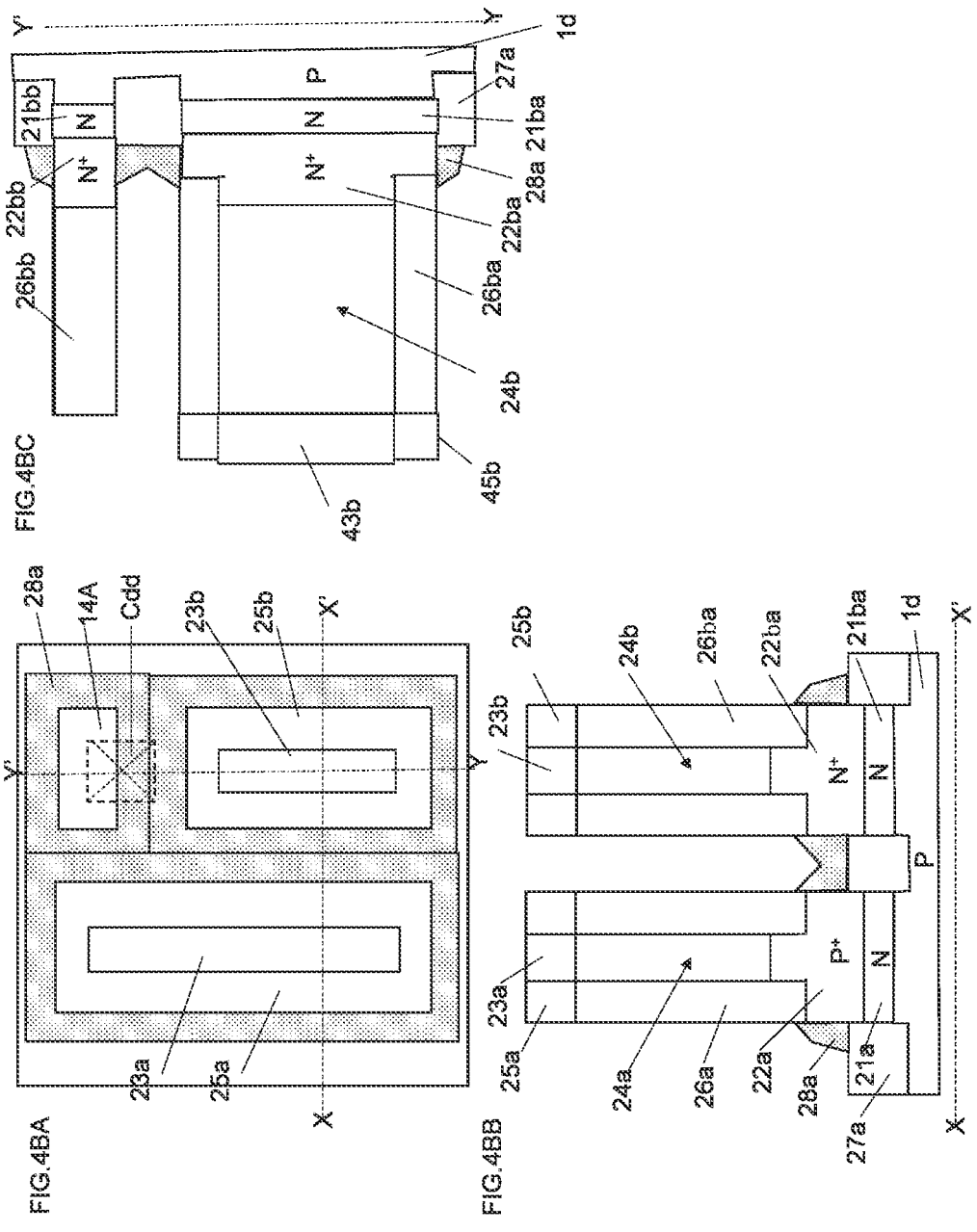

PILLAR-SHAPED SEMICONDUCTOR DEVICE AND METHOD FOR PRODUCING THE SAME

CROSS REFERENCE TO RELATED APPLICATIONS

The present application is a Continuation application of PCT/JP2020/035235, filed Sep. 17, 2020, the entire contents of which are incorporated herein by reference.

BACKGROUND OF THE INVENTION

Field of the Invention

The present invention relates to a pillar-shaped semiconductor device, and a method for producing the same.

Description of the Related Art

In recent years, transistors with a three-dimensional structure have been used for LSI (large scale integration). Among them, SGTs (surrounding gate transistors), which are pillar-shaped semiconductor elements, are drawing attention as semiconductor elements that can provide a highly integrated semiconductor device. Semiconductor devices including SGTs are demanded to have a further higher degree of integration and higher performance.

In a common planar MOS transistor, a channel extends in a horizontal direction along an upper surface of a semiconductor substrate. In contrast, a channel of a SGT extends in a direction perpendicular to an upper surface of a semiconductor substrate (for example, see Patent Literature 1 and Non Patent Literature 1). Therefore, when SGTs are used, the density of a semiconductor device can be increased more than when planar MOS transistors are used.

FIG. 7 illustrates a schematic structure view of an N-channel SGT. $N^+$ layers 101a and 101b (hereinafter, semiconductor regions containing a high concentration of donor impurities shall be referred to as "$N^+$ layers"), one of which serves as a drain when the other serves as a source, are formed at top and bottom positions in a Si pillar 100 with p-type or i-type (intrinsic) conductivity (hereinafter, a silicon semiconductor pillar shall be referred to as a "Si pillar"). A portion of the Si pillar 100 between the $N^+$ layers 101a and 101b, which serve as the source and the drain, is a channel region 102. A gate insulating layer 103 is formed so as to surround the channel region 102. A gate conductor layer 104 is formed so as to surround the gate insulating layer 103. In the SGT, the $N^+$ layers 101a and 101b serving as the source and the drain, the channel region 102, the gate insulating layer 103, and the gate conductor layer 104 are formed in a pillar shape as a whole. Therefore, the area occupied by the SGT as seen in plan view corresponds to the area occupied by a single source or drain $N^+$ layer of a planar MOS transistor. Thus, the size of a circuit chip including SGTs can be further reduced in comparison with the size of a circuit chip including planar MOS transistors.

In FIG. 7, a single SGT is formed. The actual LSI chip has many SGTs formed thereon. In such a case, connection between source and drain semiconductor regions at the bottom portion of each SGT and wire conductor layers to be connected thereto should be done with low resistance. In addition, a higher degree of integration is demanded in forming such a circuit of SGTs.

CITATION LIST

Patent Literature

Patent Literature 1: Japanese Patent Laid-Open No. 2-188966

Non Patent Literature

Non Patent Literature 1: Hiroshi Takato, Kazumasa Sunouchi, Naoko Okabe, Akihiro Nitayama, Katsuhiko Hieda, Fumio Horiguchi, and Fujio Masuoka: IEEE Transaction on Electron Devices, Vol. 38, No. 3, pp. 573-578 (1991)

SUMMARY OF THE INVENTION

Connection between source and drain impurity regions at the bottom portion of each SGT and wire conductor layers to be connected thereto should be done with low resistance. In addition, a higher degree of integration is demanded in forming such a circuit of SGTs.

A method for producing a pillar-shaped semiconductor device of the present invention for solving the foregoing problems is a method for producing a pillar-shaped semiconductor device including a first SGT (surrounding gate transistor), the first SGT including a first semiconductor pillar formed in a vertical direction on substrate, a first gate insulating layer surrounding the first semiconductor pillar, a first gate conductor layer surrounding the first gate insulating layer, a first impurity region formed above the first semiconductor pillar, the first impurity region serving as a source or a drain, and a second impurity region formed below the first semiconductor pillar, the second impurity region serving as the drain or the source, the method including forming the first semiconductor pillar on the substrate including at least a first semiconductor layer on the substrate, the first semiconductor pillar having a first mask material layer on a top portion of the first semiconductor pillar; forming a second mask material layer surrounding side faces of the first mask material layer and the first semiconductor pillar; etching the first semiconductor layer using the first mask material layer and the second mask material layer as etching masks, thereby forming an exposed first semiconductor face on an outer periphery portion below the first semiconductor pillar as seen in plan view; selectively forming a first conductor layer of a metal or alloy layer on the exposed first semiconductor face; and forming a first contact hole above the first conductor layer so as to connect the second impurity region to a wire conductor layer as seen in plan view, in which the second impurity region is continuous with the exposed first semiconductor face, and is in contact with the first conductor layer.

The foregoing method for producing a pillar-shaped semiconductor device further includes forming at least a first material layer surrounding the first semiconductor pillar; forming on the first material layer a third mask material layer surrounding the first mask material layer, or surrounding the first mask material layer and the top portion of the first semiconductor pillar; and etching the first material layer using the third mask material layer as a mask, thereby forming a fourth mask material layer, in which the first mask material layer includes the third mask material layer and the fourth mask material layer.

The foregoing method for producing a pillar-shaped semiconductor device further includes etching the first semiconductor layer using the first mask material layer and the second mask material layer as etching masks, thereby forming the exposed first semiconductor face, and then etching a side face of the exposed first semiconductor face to form an exposed semiconductor recess portion; and selectively forming the first conductor layer of a metal or alloy layer on the exposed semiconductor recess portion.

The foregoing method for producing a pillar-shaped semiconductor device further includes forming on the substrate a second semiconductor pillar adjacent to the first semiconductor pillar, the second semiconductor pillar having a fifth mask material layer on a top portion of the second semiconductor pillar; forming a sixth mask material layer surrounding side faces of the fifth mask material layer and the second semiconductor pillar; etching the first semiconductor layer using the fifth mask material layer and the sixth mask material layer as etching masks, thereby forming an exposed second semiconductor face on an outer periphery portion below the second semiconductor pillar as seen in plan view; selectively forming the first conductor layer of a metal or alloy layer on the exposed first semiconductor face and the exposed second semiconductor face; and forming the first contact hole above the first conductor layer as seen in plan view, in which the first conductor layer is continuous with and in contact with a third impurity region to serve as a source or a drain of a second SGT formed at a bottom portion of the second semiconductor pillar.

The foregoing method for producing a pillar-shaped semiconductor device further includes forming the second impurity region at a bottom portion of the first SGT and the third impurity region at the bottom portion of the second SGT such that the second impurity region and the third impurity region are located away from each other; and forming the first conductor layer in contact with the exposed first semiconductor face and the exposed second semiconductor face.

In the foregoing method for producing a pillar-shaped semiconductor device, the first conductor layer is formed continuously around the second impurity region and the third impurity region facing each other.

The foregoing method for producing a pillar-shaped semiconductor device further includes forming on the substrate a second material layer at a position away from the second impurity region and at a same level as the second impurity region; and forming the first conductor layer so that the first conductor layer surrounds and is in contact with an entire outer periphery of the second impurity region and the second material layer as seen in plan view, in which the first contact hole is formed above the first conductor layer surrounding the entire outer periphery of the second material layer as seen in plan view.

In the foregoing method for producing a pillar-shaped semiconductor device, the second material layer is formed of a semiconductor layer containing donor impurities or acceptor impurities.

The foregoing method for producing a pillar-shaped semiconductor device further includes forming on the substrate a third material layer at a position away from the second impurity region and at a same level as the second impurity region, and also at a position away from the second material layer; and forming the first conductor layer so that the first conductor layer surrounds and is in contact with an entire outer periphery of the second impurity region, the second material layer, and the third material layer as seen in plan view, in which a second contact hole is formed above the first conductor layer surrounding the third material layer.

The foregoing method for producing a pillar-shaped semiconductor device further includes forming a fourth material layer at a same level as the second impurity region and the third impurity region in the vertical direction and at a position adjacent to the second impurity region and the third impurity region; and forming a third conductor layer that is in contact with and continuous with side faces of the second impurity region, the third impurity region, and the fourth material layer.

A pillar-shaped semiconductor device of the present invention for solving the foregoing problems includes a first semiconductor pillar standing in an upright position on a substrate along a vertical direction; a first gate insulating layer surrounding the first semiconductor pillar; a first gate conductor layer surrounding the first gate insulating layer; a first impurity region above the first semiconductor pillar, the first impurity region serving as a source or a drain of a first SGT; a second impurity region continuous with a bottom portion of the first semiconductor pillar and wider than an outer periphery of the first semiconductor pillar as seen in plan view, the second impurity region serving as the source or the drain of the first SGT; a first material layer adjacent to the first semiconductor pillar and at a same level as the second impurity region in the vertical direction; and a first conductor layer surrounding an entire circumference of a side face of the second impurity region and a side face of the first material layer, in which the side face of the second impurity region and the side face of the first material layer facing each other are connected via the first conductor layer, and a first contact hole for connecting the first conductor layer to a first external wire conductor layer is provided above the first conductor layer surrounding the first material layer as seen in plan view.

The foregoing pillar-shaped semiconductor device further includes a second semiconductor pillar standing in an upright position on the substrate along the vertical direction at a position adjacent to the first semiconductor pillar; a second gate insulating layer surrounding the second semiconductor pillar; a second gate conductor layer surrounding the second gate insulating layer; a third impurity region above the second semiconductor pillar, the third impurity region serving as a source or a drain of a second SGT; a fourth impurity region continuous with a bottom portion of the second semiconductor pillar and wider than an outer periphery of the second semiconductor pillar as seen in plan view, the fourth impurity region serving as the source or the drain of the second SGT; and the first conductor layer in contact with an entire side face of the second impurity region and an entire side face of the fourth impurity region.

In the foregoing pillar-shaped semiconductor device, the first conductor layer includes at least a third conductor layer surrounding the entire side face of the second impurity region, and a fourth conductor layer surrounding the entire side face of the fourth impurity region, and side faces of the third conductor layer and the fourth conductor layer facing each other are in contact with each other.

The foregoing pillar-shaped semiconductor device further includes a second material layer located at a position adjacent to one or both of the second impurity region and the fourth impurity region and at a position away from the first material layer, and also at a same level as the second impurity region, the fourth impurity region, and the first material layer in the vertical direction, in which the first conductor layer surrounds an entire side face of the second material layer, and the first conductor layer is continuous around the second impurity region, the fourth impurity region, and the second material layer.

In the foregoing pillar-shaped semiconductor device, the first conductor layer is continuous around the second impurity region and the fourth impurity region facing each other, and a second contact hole for connecting a second external wire conductor layer to the first conductor layer is provided above the first conductor layer surrounding the second material layer as seen in plan view.

The foregoing pillar-shaped semiconductor device further includes, as seen in plan view, a fifth conductor layer as the first conductor layer surrounding the entire second impurity region, a sixth conductor layer as the first conductor layer surrounding the entire fourth impurity region, and a seventh conductor layer as the first conductor layer surrounding the entire second material layer, in which side faces of the fifth conductor layer and the sixth conductor layer facing each other are located away from each other as seen in plan view, and the fifth conductor layer, the sixth conductor layer, and the seventh conductor layer are connected at least partially at side faces of the fifth conductor layer, the sixth conductor layer, and the seventh conductor layer facing each other as seen in plan view.

BRIEF DESCRIPTION OF THE DRAWINGS

FIGS. 1EA, 1EB and 1EC are a plan view and cross-sectional structure views for illustrating the method for producing a pillar-shaped semiconductor device including SGTs according to the first embodiment.

FIGS. 1FA, 1FB and 1FC are a plan view and cross-sectional structure views for illustrating the method for producing a pillar-shaped semiconductor device including SGTs according to the first embodiment.

FIGS. 1GA, 1GB and 1GC are a plan view and cross-sectional structure views for illustrating the method for producing a pillar-shaped semiconductor device including SGTs according to the first embodiment.

FIGS. 1IA, 1IB and 1IC are a plan view and cross-sectional structure views for illustrating the method for producing a pillar-shaped semiconductor device including SGTs according to the first embodiment.

FIGS. 1JA, 1JB and 1JC are a plan view and cross-sectional structure views for illustrating the method for producing a pillar-shaped semiconductor device including SGTs according to the first embodiment.

FIGS. 1KA, 1KB and 1KC are a plan view and cross-sectional structure views for illustrating the method for producing a pillar-shaped semiconductor device including SGTs according to the first embodiment.

FIGS. 2AA, 2AB and 2AC are a plan view and cross-sectional structure views for illustrating a method for producing a pillar-shaped semiconductor device including SGTs according to a second embodiment.

FIGS. 2BA, 2BB and 2BC are a plan view and cross-sectional structure views for illustrating the method for producing a pillar-shaped semiconductor device including SGTs according to the second embodiment.

FIGS. 3AA, 3AB and 3AC are a plan view and cross-sectional structure views for illustrating a method for producing a pillar-shaped semiconductor device including SGTs according to a third embodiment.

FIGS. 3CA, 3CB and 3CC are a plan view and cross-sectional structure views for illustrating the method for producing a pillar-shaped semiconductor device including SGTs according to the third embodiment.

FIGS. 4AA, 4AB and 4AC are a plan view and cross-sectional structure views for illustrating a method for producing a pillar-shaped semiconductor device including SGTs according to a fourth embodiment.

FIGS. 4BA, 4BB and 4BC are a plan view and cross-sectional structure views for illustrating the method for producing a pillar-shaped semiconductor device including SGTs according to the fourth embodiment.

DETAILED DESCRIPTION OF THE PREFERRED EMBODIMENTS

Hereinafter, a method for producing a pillar-shaped semiconductor device according to the present invention will be described with reference to the drawings.

First Embodiment

Hereinafter, a method for producing an inverter circuit according to a first embodiment of the present invention will be described with reference to FIGS. 1AA to 1KC. The figures suffixed with letter A are plan views, the figures suffixed with letter B are cross-sectional structure views along line X-X' in the respective figures suffixed with letter A, and the figures suffixed with letter C are cross-sectional structure views along line Y-Y' in the respective figures suffixed with letter A.

Figure 1A:
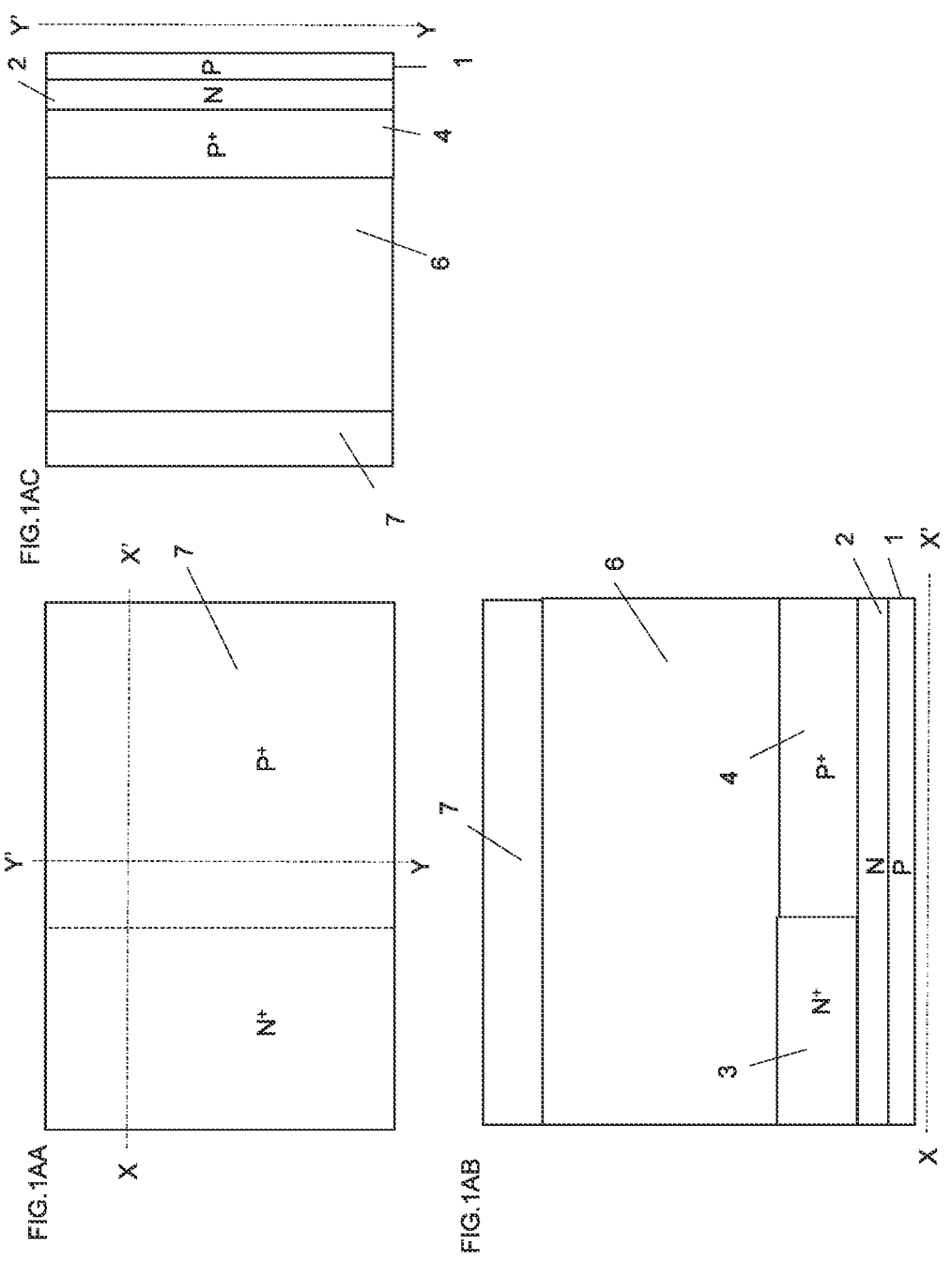
FIGS. 1AA, 1AB and 1AC are a plan view and cross-sectional structure views for illustrating a method for producing a pillar-shaped semiconductor device including SGTs according to a first embodiment.

As illustrated in FIGS. 1AA to 1AC, an N layer 2 is formed on a P-layer substrate 1 (which is an example of a "substrate" in the claims). Then, an $N^+$ layer 3 and a $P^+$ layer 4 are formed on the N layer 2. Then, a P layer 6 containing a small amount of acceptor impurities is formed on the $N^+$ layer 3 and the $P^+$ layer 4. Then, a single-layer or multilayer material layer 7 of silicon oxide ($SiO_2$), silicon nitride (SiN), and the like is formed on the P layer 6. It should be noted that the P layer 6 may be an N layer containing a small amount of donor impurities. Alternatively, the P layer 6 may be an I (Intrinsic) layer containing a sufficiently low concentration of impurities.

Figure 1B:
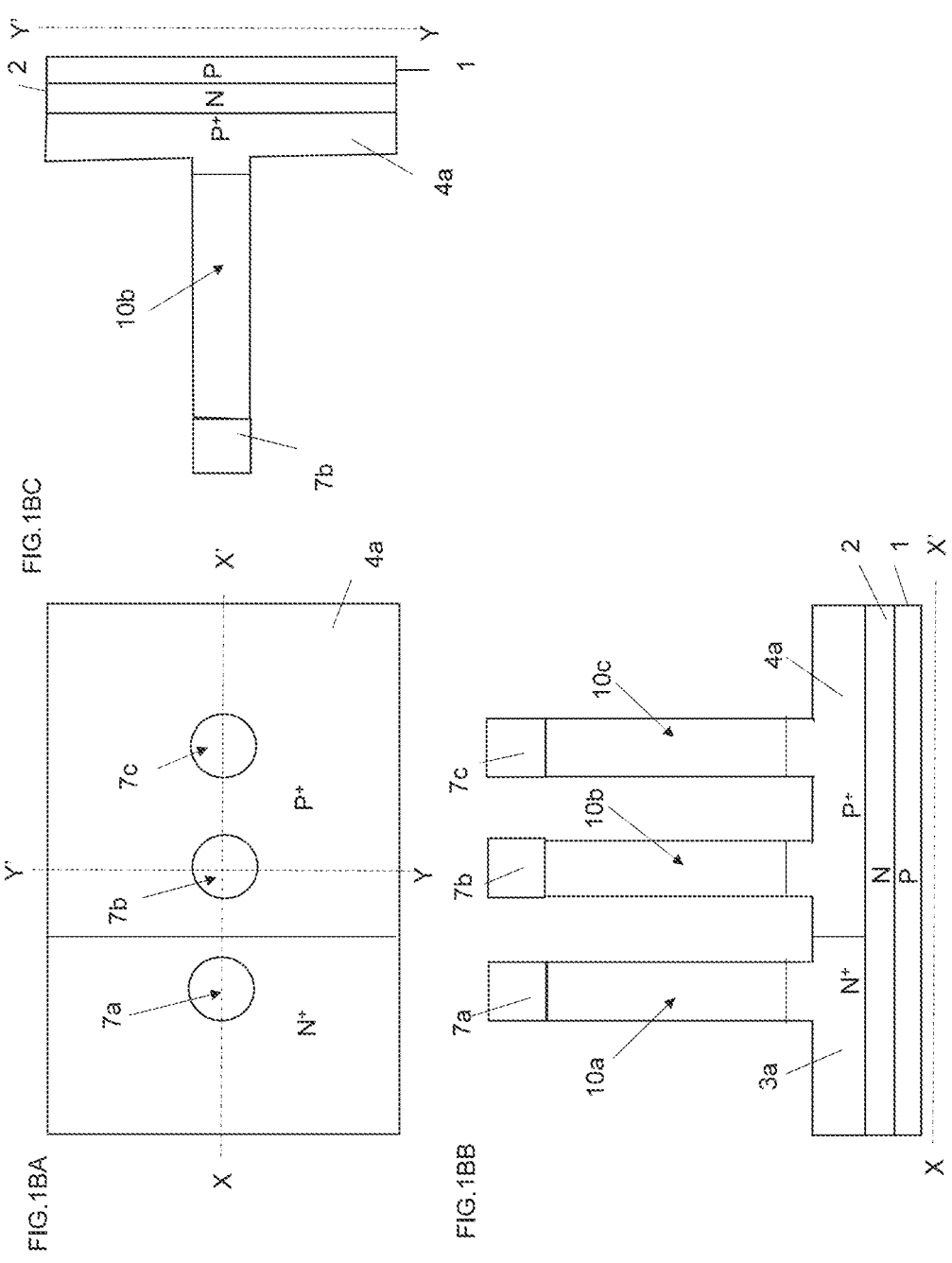
FIGS. 1BA, 1BB and 1BC are a plan view and cross-sectional structure views for illustrating the method for producing a pillar-shaped semiconductor device including SGTs according to the first embodiment.

Next, as illustrated in FIGS. 1BA to 1BC, the material layer 7 is etched using the lithography method and the RIE (reactive ion etching) method so as to form mask material layers 7a, 7b, and 7c (which are examples of a "first mask material layer" in the claims). Then, the P layer 6 and the upper portions of the $N^+$ layer 3 and the $P^+$ layer 4 are RIE-etched using the mask material layers 7a, 7b, and 7c as masks so as to form Si pillars 10a, 10b, and 10c (which are examples of a "first semiconductor pillar" and a "second semiconductor pillar" in the claims), an $N^+$ layer 3a, and a $P^+$ layer 4a.

Figure 1C:
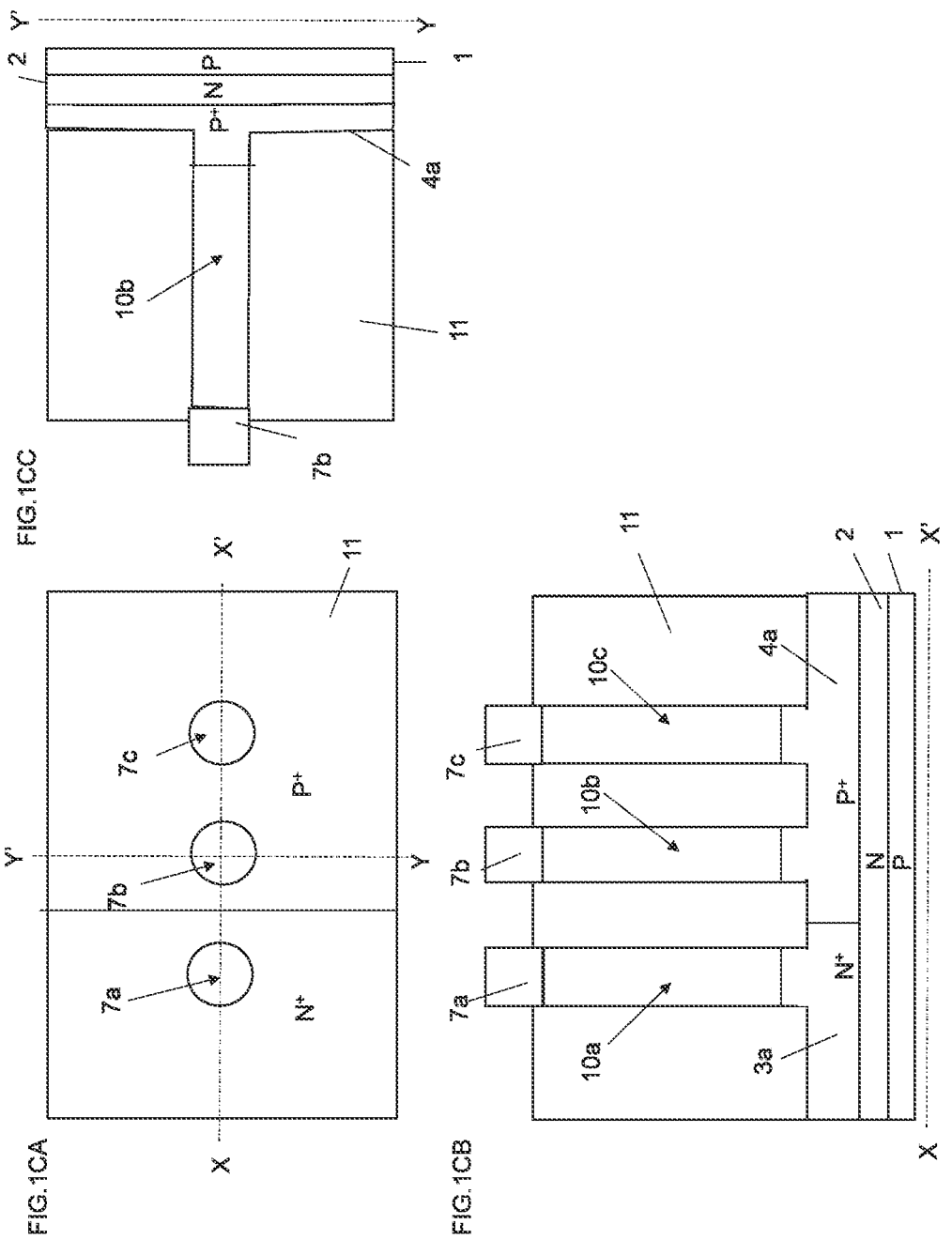
FIGS. 1CA, 1CB and 1CC are a plan view and cross-sectional structure views for illustrating the method for producing a pillar-shaped semiconductor device including SGTs according to the first embodiment.

Next, as illustrated in FIGS. 1CA to 1CC, a $SiO_2$ layer 11 is formed that has an upper surface located above the upper surfaces of the Si pillars 10a, 10b, and 10c. Instead of forming the $SiO_2$ layer 11, it is also possible to form a layer including a plurality of layers, such as a SiN layer and a $SiO_2$ layer, that are continuous around the side faces of the Si pillars 10a, 10b, and 10c as well as the outer periphery portions of the Si pillars 10a, 10b, and 10c.

Figure 1D:
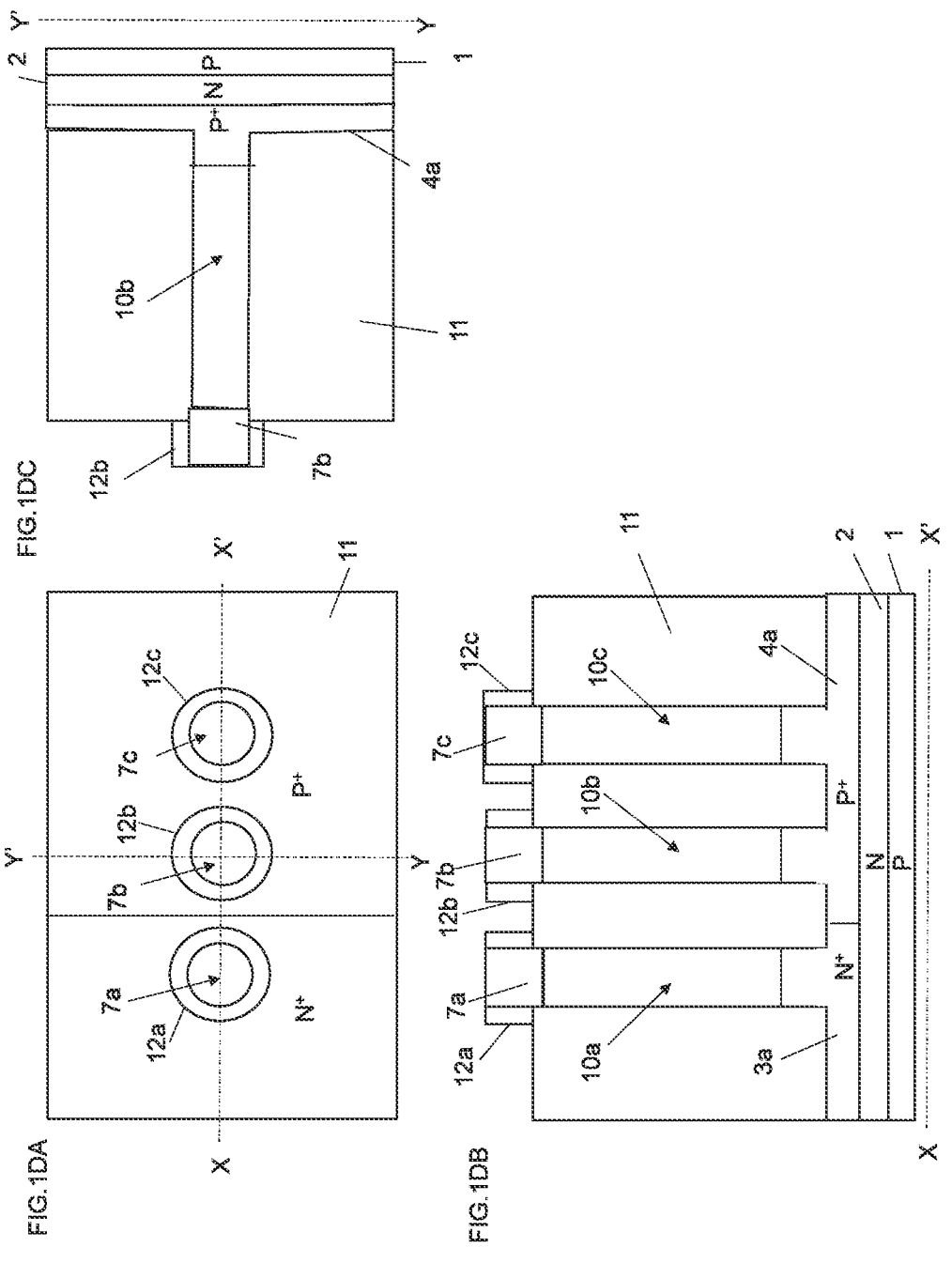
FIGS. 1DA, 1DB and 1DC are a plan view and cross-sectional structure views for illustrating the method for producing a pillar-shaped semiconductor device including SGTs according to the first embodiment.

Next, a SiN layer (not illustrated) is formed over the entire surface. Then, as illustrated in FIGS. 1DA to 1DC, the SiN layer is etched using RIE so as to form SiN layers 12a, 12b, and 12c on the respective outer periphery portions of the mask material layers 7a, 7b, and 7c. The SiN layers 12a, 12b, and 12c are respectively formed in a self-aligned manner with respect to the Si pillars 10a, 10b, and 10c as seen in plan view. The SiN layers 12a, 12b, and 12c, which are formed without using the lithography method, can be formed without so-called mask misalignment with respect to the Si pillars 10a, 10b, and 10c.

Next, as illustrated in FIGS. 1EA to 1EC, a mask material layer 14 is formed that partially overlaps the Si pillars 10a, 10b, and 10c as seen in plan view.

Next, as illustrated in FIGS. 1FA to 1FC, the $SiO_2$ layer 11 is etched using the SiN layers 12a, 12b, and 12c (which are examples of a "third mask material layer" in the claims) and the mask material layers 7a, 7b, 7c, and 14 as etching masks so as to form a SiO2 layer 11a (which is an example of a "fourth mask material layer" in the claims). Next, the $N^+$ layer 3a, the P+ layer 4a, the N layer 2, and the upper portion of the P-layer substrate 1 are etched using the SiN layers 12a, 12b, and 12c and the $SiO_2$ layer 11a (a combination of the material layers: the SiN layers 12a, 12b, and 12c and the SiO2 layer 11a is an example of a "second mask material layer" in the claims) and the mask material layer 14 as etching masks so as to form an $N^+$ layer 3aa and a P+ layer 4aa (which are examples of a "second impurity region" in the claims), an N layer 2a, and a P-layer substrate 1a. The side faces of the $N^+$ layer 3aa and the P+ layer 4aa are exposed. The SiN layers 12a, 12b, and 12c are respectively formed in a self-aligned manner with respect to the Si pillars 10a, 10b, and 10c as seen in plan view. Accordingly, the positions of the side faces of the $N^+$ layer 3aa and the $P^+$ layer 4aa located below the SiN layers 12a, 12b, and 12c are self-aligned with respect to the Si pillars 10a, 10b, and 10c. The SiN layers 12a, 12b, and 12c and the $SiO_2$ layer 11a serve the role of etching masks for etching the $N^+$ layer 3a, the $P^+$ layer 4a, the N layer 2, and the upper portion of the P-layer substrate 1. Such etching mask layers may be formed using other methods. For example, in FIGS. 1CA to 1CC, the $SiO_2$ layer 11 is deposited covering the entire mask material layers 7a, 7b, and 7c. Then, the upper surface of the $SiO_2$ layer 11 is planarized through CMP (chemical mechanical polishing) up to the upper surfaces of the mask material layers 7a, 7b, and 7c. Then, the $SiO_2$ layer 11 is etched through RIE so that a $SiO_2$ layer (which is an example of the "second mask material layer" in the claims) to serve as a mask material layer is formed on the side faces of the Si pillars 10a, 10b, and 10c and the mask material layers 7a, 7b, and 7c in a self-aligned manner with respect to the Si pillars 10a, 10b, and 10c.

Next, the mask material layer 14 is removed. Then, as illustrated in FIGS. 1GA to 1GC, a $SiO_2$ layer 15 is formed on the P-layer substrate 1a so that its upper surface position is located at the level of the upper surface position of the N layer 2a. Accordingly, exposed side faces of the $N^+$ layer 3aa and the $P^+$ layer 4aa (which are examples of an "exposed first semiconductor face" in the claims) are formed. In such a case, the Si pillars 10a, 10b, and 10c, the N layer 2a, and the P-layer substrate 1a are surrounded by the insulating layers.

Figure 1H:
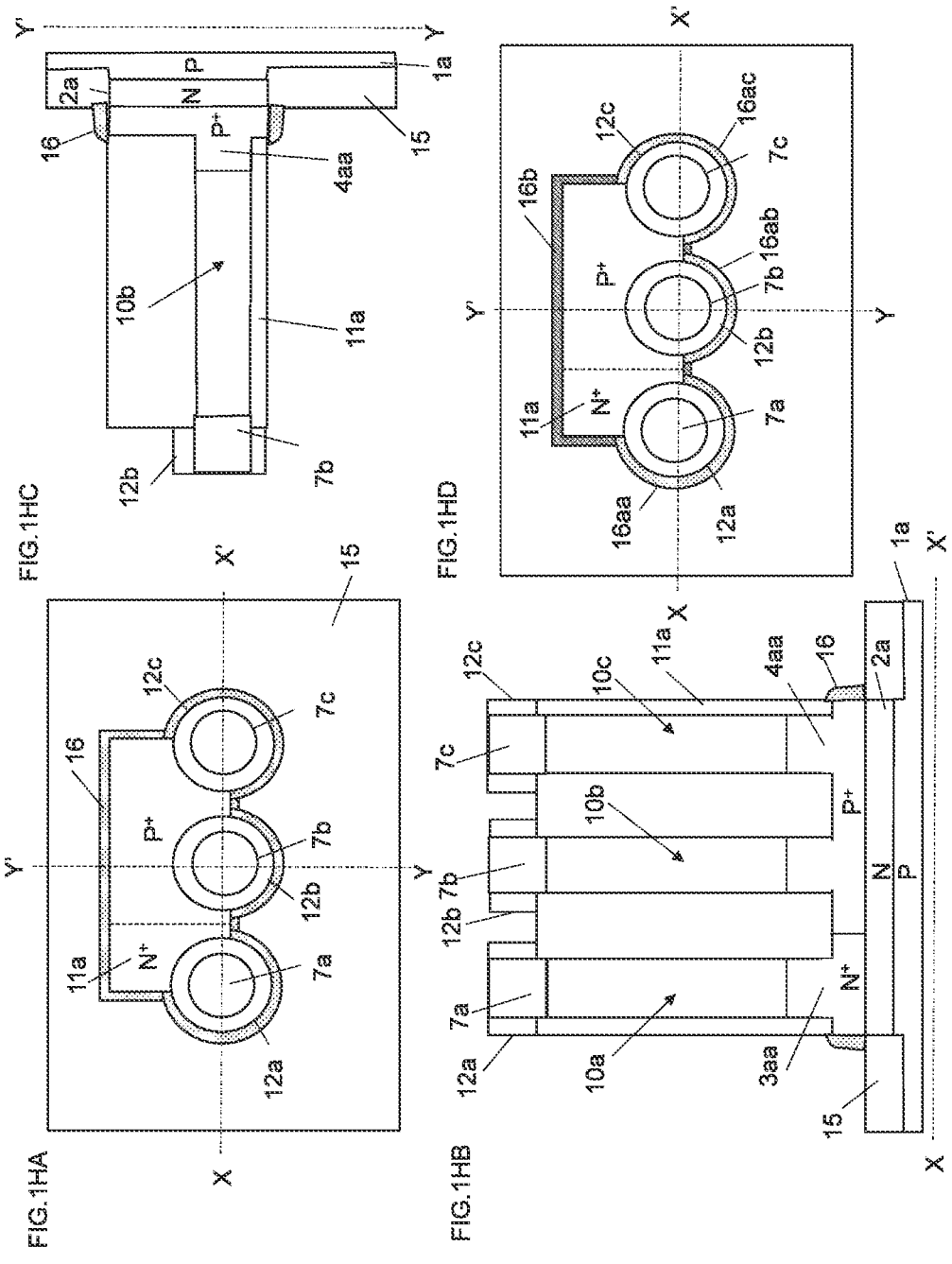
FIGS. 1HA, 1HB, 1HC and 1HD are plan views and cross-sectional structure views for illustrating the method for producing a pillar-shaped semiconductor device including SGTs according to the first embodiment.

Next, as illustrated in FIGS. 1HA to 1HD, a tungsten layer (i.e., a W layer) 16 (which is an example of a "first conductor layer" in the claims) is formed on the outer peripheral side faces of the $N^+$ layer 3aa and the $P^+$ layer 4aa using the selective epitaxial growth method. As illustrated in FIG. 1HD, the W layer 16 surrounding the $N^+$ layer 3aa and the $P^+$ layer 4aa includes, as seen in plan view, W layers 16aa, 16ab, and 16ac that surround the respective outer periphery portions of the Si pillars 10a, 10b, and 10c, and a W layer 16b that connects the outer periphery portions of the W layers 16aa, 16ab, and 16ac together and is connected to the side faces of the $N^+$ layer 3aa and the $P^+$ layer 4aa. The W layers 16aa, 16ab, and 16ac are respectively formed in a self-aligned manner with respect to the Si pillars 10a, 10b, and 10c. It is also possible to form a barrier metal layer of Ti, Ta, or the like for reducing the contact resistance between the W layer 16 and the $N^+$ layer 3aa and the $P^+$ layer 4aa, between the W layer 16 and the $N^+$ layer 3aa and the $P^+$ layer 4aa.

Next, as illustrated in FIGS. 1IA to 1IC, the SiN layers 12a, 12b, and 12c and the $SiO_2$ layer 11a are removed. Then, a $SiO_2$ layer 18 is formed so that its upper surface position is located around the upper surface positions of the $N^+$ layer 3aa and the $P^+$ layer 4aa.

Next, as illustrated in FIGS. 1JA to 1JC, a hafnium oxide layer ($HfO_2$ layer) 20 (which is an example of a "first gate insulating layer" in the claims) as a gate insulating layer is formed on the $SiO_2$ layer 18 so as to surround the Si pillars 10a, 10b, and 10c. Then, a TiN layer 211 (which is an example of a "first gate conductor layer" in the claims) as a gate conductor layer and a $SiO_2$ layer 221 are formed so as to surround the $HfO_2$ layer 20 on the outer periphery portions of the Si pillars 10a, 10b, and 10c. Then, a SiN layer 231 is formed on the $HfO_2$ layer 20, the TiN layer 211, and the $SiO_2$ layer 221. Then, an $N^+$ layer 27a and $P^+$ layers 27b and 27c are respectively formed so as to surround the Si pillars 10a, 10b, and 10c. Then, heat treatment is applied to form an $N^+$ layer N1 and $P^+$ layers P1 and P2 (which are examples of a "first impurity region" in the claims) on the respective top portions of the Si pillars 10a, 10b, and 10c. Then, W layers 281a, 281b, and 281c are respectively formed on the $N^+$ layer 27a and the $P^+$ layers 27b and 27c. The $HfO_2$ layer 20 as the gate insulating layer may have a two-layer structure including a $SiO_2$ layer. Alternatively, the $HfO_2$ layer 20 may be formed using other single-layer or multilayer material layers. The TiN layer 211 as the gate conductor layer may have a two-layer structure of a TiN layer and a W layer. Alternatively, the TiN layer 211 may be formed using other single-layer or multilayer material layers.

Next, as illustrated in FIGS. 1KA to 1KC, a $SiO_2$ layer 301 is formed on the entire surface. Then, a contact hole C1 is formed above the W layer 281a, a contact hole C2 is formed above the W layer 281b, a contact hole C3 is formed above the W layer 281c, a contact hole C4 (which is an example of a "first contact hole" in the claims) having a bottom portion in contact with the W layer 16 is formed, and a contact hole C5 having a bottom portion in contact with the TiN layer 211 is formed. Then, the following are formed: a substrate wire metal layer Vss connected to the W layer 281a via the contact hole C1, a power supply wire metal layer Vdd connected to the W layers 281b and 281c via the contact holes C2 and C3, respectively, an output wire metal layer Vout connected to the W layer 16 via the contact hole C4, and an input wire metal layer Vin connected to the TiN layer 211 via the contact hole C5. Accordingly, an inverter circuit is formed on the P-layer substrate 1a.

Although the present embodiment has been described using the Si pillars 10a, 10b, and 10c that are circular in shape as seen in plan view, the Si pillars may have other shapes, such as rectangular or elliptical. It is also possible to form Si pillars with different shapes as seen in plan view in a mixed manner on a single P-layer substrate 1a.

The N$^+$ layer 3aa and the P$^+$ layer 4aa are respectively formed from the N$^+$ layer 3 and the P$^+$ layer 4 formed using the epitaxial method, for example, as illustrated in FIGS. 1AA to 1AC. In contrast, it is also possible to, without forming the N$^+$ layer 3 and the P$^+$ layer 4, first expose the side faces of the P layer 6 on the outer periphery portions of the Si pillars 10a and 10b, and form semiconductor layers containing donor or acceptor impurities on the exposed portions before forming the W layer 16, and then form impurity regions on the side faces of the P layer 6 through heat treatment. Then, the W layer 16 may be formed. It is also possible to form the N$^+$ layer 3aa and the P$^+$ layer 4aa using other methods.

In the description herein, the N$^+$ layer N1 and the P$^+$ layers P1 and P2 are formed through heat diffusion from the N$^+$ layer 27a and the P$^+$ layers 26b and 26c. In contrast, the N$^+$ layer N1 and the P$^+$ layers P1 and P2 may be formed using an N$^+$ layer and P$^+$ layers that are formed before the material layer 7 in FIGS. 1AA to 1AC is formed. Alternatively, the N$^+$ layer N1 and the P$^+$ layers P1 and P2 may be formed using other methods.

The present embodiment has the following features.

1. As illustrated in FIGS. 1HA to 1HD, the W layer 16, which is a low-resistance conductor layer surrounding the N$^+$ layer 3aa and the P$^+$ layer 4aa as seen in plan view, reduces the series resistance of the source or the drain. The W layer 16 surrounding the N$^+$ layer 3aa and the P$^+$ layer 4aa includes the W layers 16aa, 16ab, and 16ac that surround the respective outer periphery portions of the Si pillars 10a, 10b, and 10c, and the W layer 16b that connects the outer periphery portions of the W layers 16aa, 16ab, and 16ac together and is connected to the side faces of the N$^+$ layer 3aa and the P$^+$ layer 4aa. The W layers 16aa, 16ab, and 16ac are respectively formed in a self-aligned manner with respect to the Si pillars 10a, 10b, and 10c. Accordingly, density can be increased in the X-X' direction and the Y-direction.

2. As illustrated in FIGS. 1KA to 1KC, the contact hole C4 for electrically connecting the N$^+$ layer 3aa and the P$^+$ layer 4aa and the output wire metal layer Vout may be provided at any place that overlaps the W layer 16 surrounding the side faces of the N$^+$ layer 3aa and the P$^+$ layer 4aa. When the W layer 16 is not provided, the position of the contact hole C4 is limited to a place including the boundary between the N$^+$ layer 3aa and the P$^+$ layer 4aa. However, with the method provided by the present invention, design flexibility regarding the position of formation of the contact hole C4 can be increased. This leads to a higher degree of integration of the circuit including the SGTs.

Second Embodiment

Hereinafter, a method for producing an inverter circuit according to a second embodiment of the present invention will be described with reference to FIGS. 2AA-2AC and 2BA-2BC. FIGS. 2AA and 2BA are plan views, FIGS. 2AB and 2BB are cross-sectional structure views along line X-X' in FIGS. 2AA and 2BA, and FIGS. 2AC and 2BC are cross-sectional structure views along line Y-Y' in FIGS. 2AA and 2BA.

First, the steps illustrated in FIGS. 1AA-1AC to 1GA-1GC of the first embodiment are executed. Then, as illustrated in FIGS. 2AA to 2AC, the exposed side faces of the N$^+$ layer 3aa and the P$^+$ layer 4aa are etched using the SiO$_2$ layers 11a and 15 as masks so as to form an exposed N$^+$ layer recess portion 151 (which is an example of an "exposed semiconductor recess portion" in the claims).

Next, as illustrated in FIGS. 2BA to 2BC, a W layer 16A is formed on the recess portion using the selective epitaxial method. Then, the steps illustrated in FIGS. 1IA-1IC to 1KA-1KC of the first embodiment are executed. Accordingly, an inverter circuit is formed on the P-layer substrate 1a as in the first embodiment.

In the present embodiment, the W layer 16A formed on the outer periphery portions of the N$^+$ layer 3aa and the P$^+$ layer 4aa can have a width greater than that of the W layer 16 in the first embodiment as seen in plan view. This can reduce the generation of defects, such as peeling, in the step following the formation of the W layer 16A.

Third Embodiment

Hereinafter, a method for producing an inverter circuit according to a third embodiment of the present invention will be described with reference to FIGS. 3AA-3AC to 3CA-3CC. FIGS. 3AA, 3BA and 3CA are plan views, FIGS. 3AB, 3BB and 3CB are cross-sectional structure views along line X-X' in FIGS. 3AA, 3BA and 3CA, and FIGS. 3AC, 3BC and 3CC are cross-sectional structure views along line Y-Y' in FIGS. 3AA, 3BA and 3CA.

The basic steps are as follows. The steps in FIGS. 1AA-1AC to 1GA-1GC of the first embodiment are executed, and as illustrated in FIGS. 3AA to 3AC, N layers 21a and 21b, a P$^+$ layer 22a, an N$^+$ layer 22b, and Si pillars 24a and 24b are formed on a P-layer substrate 1c. The Si pillars 24a and 24b are rectangular in shape as seen in plan view. The Si pillars 24a and 24b are respectively formed using mask material layers 23a and 23b as etching masks. SiN layers 25a and 25b respectively surrounding the mask material layers 23a and 23b are formed in a self-aligned manner with respect to the Si pillars 24a and 24b as in the first embodiment. Then, a mask material layer (not illustrated) corresponding to the mask material layer 14 illustrated in FIGS. 1EA to 1EC is formed in a shape that partially overlaps the SiN layer 25b and extends in the Y-Y' direction from the Si pillar 24b as seen in plan view. Accordingly, as illustrated in FIG. 3AC, a SiO$_2$ layer 26b is formed in a shape that extends in the Y-Y' direction beyond the SiN layer 25b as seen in plan view. Then, etching is performed as in FIGS. 1FA to 1FC using the SiN layers 25a and 25b, the SiO2 layers 26a and 26b, and the mask material layers 23a and 23b as etching masks so as to form the N layers 21a and 21b, the P$^+$ layer 22a, the N$^+$ layer 22b. This etching is performed so that the bottom portion is located below the upper surface of the P-layer substrate 1c.

Figure 3B:
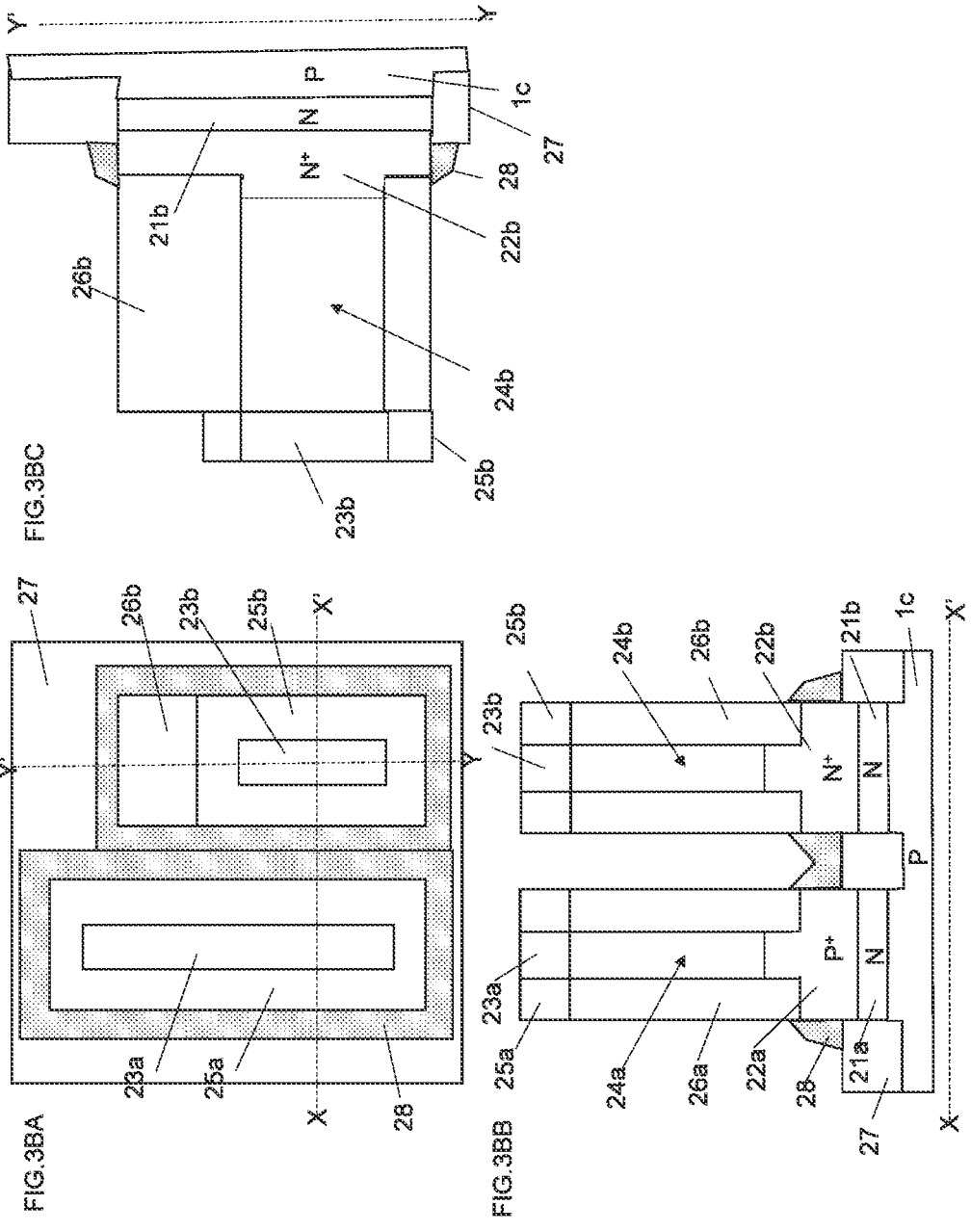
FIGS. 3BA, 3BB and 3BC are a plan view and cross-sectional structure views for illustrating the method for producing a pillar-shaped semiconductor device including SGTs according to the third embodiment.

Next, as illustrated in FIGS. 3BA to 3BC, a SiO$_2$ layer 27 is formed on the P-layer substrate 1c so that it surrounds the P$^+$ layer 22a and the N$^+$ layer 22b, and its upper surface position is located around the bottom portions of the P$^+$ layer 22a and the N$^+$ layer 22b. Then, a W layer 28 is formed on the exposed side faces of the P$^+$ layer 22a and the N$^+$ layer 22b using the selective epitaxial growth method. In such a case, the W layer 28 is formed continuously around the P$^+$ layer 22a and the N$^+$ layer 22b. With the W layer 28, the P$^+$ layer 22a and the N$^+$ layer 22b are electrically connected at their side faces in the longitudinal direction (i.e., Y-Y' direction) of the Si pillars 24a and 24b.

Next, as illustrated in FIGS. 3CA to 3CC, a SiO$_2$ layer 30 is formed so that its upper surface position is located around the upper surface positions of the P$^+$ layer 22a and the N$^+$ layer 22b. Then, a HfO$_2$ layer 31 as a gate insulating layer is formed so as to surround the Si pillars 24a and 24b and cover the SiO$_2$ layer 30. Then, a TiN layer 32 as a gate conductor layer and a SiO$_2$ layer 33 are formed so as to surround the HfO$_2$ layer 31 on the outer periphery portions of the Si pillars 24a and 24b. Then, a SiN layer 34 is formed on the HfO$_2$ layer 31, the TiN layer 32, and the SiO$_2$ layer 33. Then, a P$^+$ layer 36a and an N$^+$ layer 36b are formed so as to surround the respective top portions of the Si pillars 24a and 24b. Then, heat treatment is applied to form a P$^+$ layer 37a and an N$^+$ layer 37b on the respective top portions of the Si pillars 24a and 24b. Then, W layers 38a and 38b are respectively formed on the P$^+$ layer 36a and the N$^+$ layer 36b. Then, a SiO$_2$ layer 39 is formed on the entire surface. Then, a contact hole Ca is formed above the W layer 38a, a contact hole Cb is formed above the W layer 38b, a contact hole Cc having a bottom portion in contact with the TiN layer 32 is formed, and a contact hole Cd having a bottom portion in contact with the W layer 28 is formed. Then, the following are formed: a power supply wire metal layer Vdd connected to the W layer 38a via the contact hole Ca, a substrate wire metal layer Vss connected to the W layer 38b via the contact hole Cb, an input wire metal layer Vin connected to the TiN layer 32 via the contact hole Cc, and an output wire metal layer Vout connected to the W layer 28 via the contact hole Cd. Accordingly, an inverter circuit is formed on the P-layer substrate 1c.

The present embodiment has the following features.

(Feature 1)

1. In the case of the Si pillars 24a and 24b that are long in the Y-Y' direction as in the present embodiment, if the P$^+$ layer 22a below the Si pillar 24a and the N$^+$ layer 22b below the Si pillar 24b are continuous between the Si pillars 24a and 24b as in the first embodiment, the W layer 28 is not formed between the Si pillars 24a and 24b. That is, the W layer 28 is formed only on a single side of each of the Si pillars 24a and 24b in the X-X' direction as seen in plan view. In contrast, in the present embodiment, the W layer 28 is formed on each of the opposite sides of the Si pillars 24a and 24b in the X-X' direction as seen in plan view. Accordingly, in comparison with a case where the P$^+$ layer 22a below the Si pillar 24a and the N$^+$ layer 22b below the Si pillar 24b are continuous between the Si pillars 24a and 24b as in the first embodiment, contact resistance between each of the P$^+$ layer 22a and the N$^+$ layer 22b and the W layer 28 can be reduced in the present embodiment. In addition, an electric field distribution in the P$^+$ layer 22a and the N$^+$ layer 22b can be made uniform. This leads to an increased amount of drain-source current during the operation of the SGTs.

2. The present embodiment illustrates an example in which a P-channel SGT is formed in the Si pillar 24a, and an N-channel SGT is formed in the Si pillar 24b. In contrast, it is also possible to, in forming a circuit including a plurality of Si pillars 24a and 24b each arranged in the X-X' direction or the Y-Y' direction as seen in plan view, form a uniform electric field distribution in an impurity region, which serves as a source or a drain, at the bottom portion of each Si pillar, and reduce fluctuation in the electrical characteristics of each SGT. This also leads to simplifying the design of the circuit including the SGTs.

Fourth Embodiment

Hereinafter, an inverter circuit according to a fourth embodiment of the present invention will be described with reference to FIGS. 4AA-4AC and 4BA-4BC. FIGS. 4AA and 4BA are plan views, FIGS. 4AB and 4BB are cross-sectional structure views along line X-X' in FIGS. 4AA and 4BA, and FIGS. 4AC and 4BC are cross-sectional structure views along line Y-Y' in FIGS. 4AA and 4BA.

The same steps as those in FIGS. 3AA to 3AC of the third embodiment are executed. As illustrated in FIGS. 4AA to 4AC, the N layer 21a, the P$^+$ layer 22a, the Si pillars 24a and 24b, the SiO$_2$ layer 26a, the SiN layers 25a and 25b, and the mask material layers 23a and 23b are the same as those in FIGS. 3AA to 3AC. However, the SiO$_2$ layer 26b in FIGS. 4AA to 4AC is divided into two regions: SiO$_2$ layers 26ba and 26bb. The P$^+$ layer 22b is divided into two regions: P$^+$ layers 22ba and 22bb. The N layer 21b is divided into two regions: N layers 21ba and 21bb. Thus, a P-layer substrate 1d is formed that is recessed in conformity with the shapes of the N layers 21ba and 22bb. The SiO$_2$ layer 26bb, the P$^+$ layer 22bb, and the N layer 21bb are formed using a mask material layer 14A, which serves the same role as the mask material layer 14 in FIGS. 1FA to 1FC, as an etching mask.

Next, as illustrated in FIGS. 4BA to 4BC, a SiO$_2$ layer 27a is formed so that its upper surface position is located around the bottom portions of the P$^+$ layer 22a and the N$^+$ layer 22ba. Then, a W layer 28a is formed in contact with the exposed side faces of the P$^+$ layer 22a and the N$^+$ layers 22ba and 22bb. Accordingly, the W layer 28a is formed such that it encircles and surrounds the outer periphery of each of the P$^+$ layer 22a, the N$^+$ layer 22ba, and the N$^+$ layer 22bb. Then, the same steps as those in FIGS. 3CA to 3CC are performed so that an inverter circuit is formed on the P-layer substrate 1d. In such a case, a contact hole Cdd connected to the W layer 28a is formed at the same place as the contact hole Cd in FIGS. 3CA to 3CC. The contact hole Cdd may be provided at any place in contact with the W layer 28a as seen in plan view as described in the first embodiment.

In the foregoing description made in comparison with the third embodiment, the N$^+$ layer 22bb is provided so as to allow the entire outer periphery of the N$^+$ layer 22ba below the Si pillar 24b to be uniformly surrounded by the W layer 28a. When the contact hole Cdd is formed in a different place adjacent to the Si pillars 24a and 24b, the N$^+$ layer 22bb may be moved correspondingly. In FIGS. 4BA to 4BC, the contact hole Cdd is provided between the N$^+$ layer 22ba and the N$^+$ layer 22bb as seen in plan view. However, the contact hole Cdd may be provided anywhere above a part of a region of the W layer 28a surrounding the N$^+$ layer 22bb. In addition, even when the Si pillars 24a and 24b have the same length along the Y-Y' direction as seen in plan view, the N$^+$ layer 22bb may be provided at any place adjacent to the P$^+$ layer 22a and the N$^+$ layer 22ba.

The N$^+$ layer 22*bb* is provided so as to allow the entire outer periphery of the N$^+$ layer 22*ba* to be uniformly surrounded by the W layer 28*a* as seen in plan view and also to secure a region for providing the contact hole Cdd for connection to an external wire. Therefore, the N$^+$ layer 22*bb* need not be an impurity layer, and may be other material layers.

The present embodiment has the following features.

1. In the third embodiment, as illustrated in FIGS. 3BA to 3BC, the N$^+$ layer 22*b* below the Si pillar 24*b* extends upward in the Y-Y' direction beyond the SiN layer 25*b*, which surrounds the Si pillar 24*b* with a fixed width, as seen in plan view. Therefore, the W layer 28 is uniformly formed on the outer periphery of the Si pillar 24*a* while being away from the Si pillar 24*a* equidistantly, while the upper portion of the W layer 28 is formed around the Si pillar 24*b* while being more away from the Si pillar 24*b* in comparison with other side faces. In contrast, in the present embodiment, as seen in FIGS. 4BA to 4BC, the W layer 28*a* is formed around each of the Si pillars 24*a* and 24*b* while being away from each of the Si pillars 24*a* and 24*b* equidistantly. Accordingly, in the present embodiment, contact resistance between the N$^+$ layer 22*ba* and the W layer 28 can be reduced. It is also possible to form a uniform electric field distribution in the N$^+$ layer 22*ba*, which leads to an increased amount of drain-source current during the operation of the SGT.

2. The foregoing description includes the connection between the P$^+$ layer 22*a* and the N$^+$ layer 22*ba* below the two respective Si pillars 24*a* and 24*b* via the W layer 28*a*, and the provision of the contact hole Cdd. Applying the present embodiment can, even when there is one semiconductor pillar or there are three or more semiconductor pillars to be connected, uniformly form the W layer 28*a* on the entire outer periphery of an impurity region at the bottom portion of each semiconductor pillar as seen in plan view.

3. In the present embodiment, the N$^+$ layer 22*bb* formed to provide the contact hole Cdd may be provided adjacent to the semiconductor pillars 24*a* and 24*b*. Accordingly, design flexibility regarding the provision of the contact hole Cdd can be increased.

Fifth Embodiment

A method for producing an inverter circuit according to a fifth embodiment of the present invention will be described with reference to FIG. 5. In the following embodiment, portions identical to those in the foregoing embodiments are denoted by identical reference signs, and repeated description will be omitted.

Figure 5:
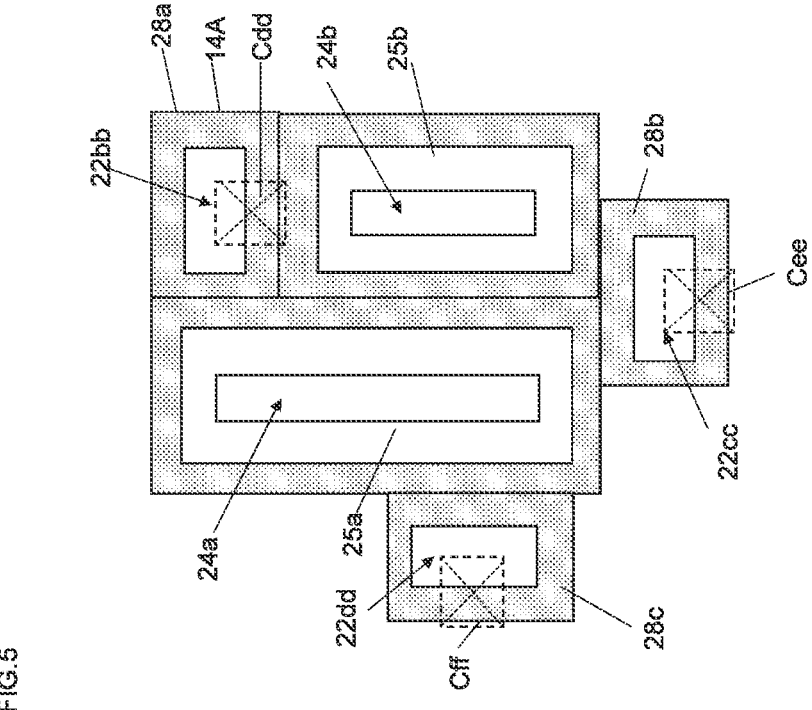
FIG. 5 is a plan view for illustrating a method for producing a pillar-shaped semiconductor device including SGTs according to a fifth embodiment.

As illustrated in FIG. 5, N$^+$ layers 22*cc* and 22*dd* are formed on the outer side of the W layer 28*a* illustrated in FIGS. 4BA to 4BC as seen in plan view as with the N$^+$ layer 22*bb*. Then, W layers 28*b* and 28*c* are formed as with the W layer 28*a*. The W layers 28*b* and 28*c* are formed continuously with the W layer 28*a*. The W layers 28*a*, 28*b*, and 28*c* are formed at the same time. Then, a contact hole Cee is formed above the W layer 28*b* as seen in plan view. Likewise, a contact hole Cff is formed above the W layer 28*c* as seen in plan view. Then, the W layers 28*a*, 28*b*, and 28*c* are respectively connected to external wires via the contact holes Cdd, Cee, and Cff.

The N$^+$ layers 22*bb*, 22*cc*, and 22*dd* may have different shapes. The respective distances between the N$^+$ layers 22*bb*, 22*cc*, and 22*dd* and the W layers 28*a*, 28*b*, and 28*c* are set so that when the W layers 28*a*, 28*b*, and 28*c* are formed at the same time, the W layers 28*a*, 28*b*, and 28*c* are formed continuously.

The present embodiment has the following features.

1. The contact holes Cdd, Cee, and Cff are respectively provided to connect external wires to the W layers 28*a*, 28*b*, and 28*c* that are connected together. Connection with external wires should be made so that the overall degree of integration will not decrease due to the arrangement relationship with peripheral circuits formed on the same substrate. For example, when connection with external wires is made only from a single point, such as the contact hole Cdd, as in FIGS. 4BA to 4BC, for connection to a plurality of peripheral circuits, the paths of the wires connected to some of the circuits become long, which may pose a problem with the increase in the degree of integration. In contrast, as illustrated in the present example, arranging the N$^+$ layers 22*bb*, 22*cc*, and 22*dd* according to the arrangement of peripheral circuits to be connected easily allows for highly integrated design. The number of the N$^+$ layers 22*bb*, 22*cc*, and 22*dd* can be easily changed as needed.

Sixth Embodiment

A method for producing an SGT circuit according to a sixth embodiment of the present invention will be described with reference to FIG. 6.

Figure 6:
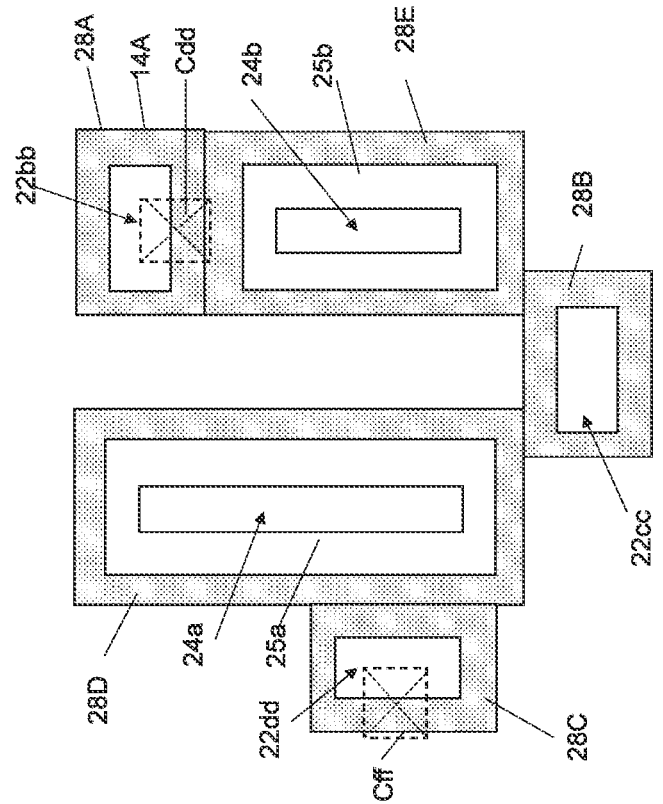
FIG. 6 is a plan view for illustrating a method for producing a pillar-shaped semiconductor device including SGTs according to a sixth embodiment.
Figure 7:
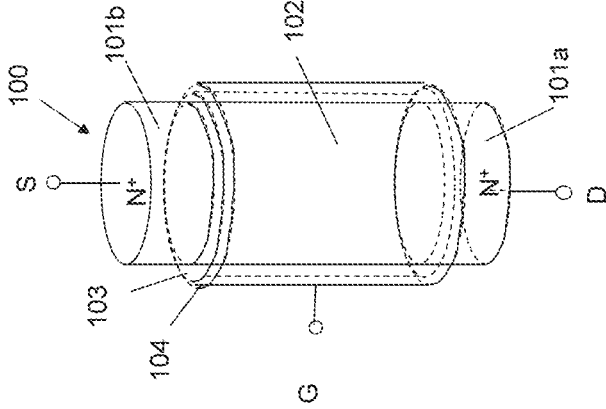
FIG. 7 is a three-dimensional structure view for illustrating the conventional art.

As illustrated in FIG. 6, the Si pillars 24*a* and 24*b* are formed away from each other. The step is the same as that in the fifth embodiment. In such a case, W layers 28D and 28E, which surround the respective outer peripheries of the Si pillars 24*a* and 24*b*, are not in contact with each other at their opposed side faces. In contrast, the W layers 28D and 28E are formed so as to be in contact with a W layer 28B surrounding the outer periphery of the N$^+$ layer 22*cc*. Accordingly, the W layers 28D and 28E are connected via the W layer 28B.

In the description of the present embodiment, a contact hole for connection to an external wire is not provided above the W layer 28B as seen in plan view. However, a contact hole for connection to an external wire may be provided above the W layer 28B if necessary in terms of the circuit design.

The present embodiment has the following features.

In forming a circuit in which the respective gate conductor layers around the Si pillars 24*a* and 24*b* are electrically independently connected to external wires, for example, it is necessary to form the two gate conductor layers away from each other. Therefore, it is necessary to form the Si pillars 24*a* and 24*b* away from each other. In such a case, the W layers 28D and 28E are located away from each other. In contrast, in the present embodiment, the W layers 28D and 28E are connected via the W layer 28B surrounding the N$^+$ layer 22*cc*. In such a case, the contact hole Cee illustrated in FIG. 5 may be either provided or not provided above the W layer 28B. Accordingly, the W layers 28D and 28E can be easily connected.

Other Embodiments

Although a single SGT is formed in a single semiconductor pillar in each of the foregoing embodiments according to the present invention, the present invention is also applicable to the formation of a circuit in which two or more SGTs are formed in a single semiconductor pillar.

Although the Si pillars 10*a*, 10*b*, and 10*c* are formed in the first embodiment, the pillars may be semiconductor pillars of other semiconductor materials. This is also true of the other embodiments according to the present invention.

Each of the N$^+$ layers 3$aa$ and 27$a$ and the P$^+$ layers 4$aa$, 27$b$, and 27$c$ in the first embodiment may be formed of a layer of Si or other semiconductor materials containing donor or acceptor impurities. In addition, the N$^+$ layers 3$aa$ and 27$a$ and the P$^+$ layers 4$aa$, 27$b$, and 27$c$ may be formed of layers of different semiconductor materials. This is also true of the other embodiments according to the present invention.

In the first embodiment, the W layer 16 is formed using the selective epitaxial crystal growth method. However, the W layer 16 may be selectively formed using other methods including a method of forming the W layer 16 by repeatedly performing CDE (chemical dry etching) and the common epitaxial crystal growth. This is also true of the other embodiments according to the present invention.

As the mask material layers 7$a$, 7$b$, and 7$c$ in the first embodiment, it is also possible to use other single-layer or multilayer material layers containing organic materials or inorganic materials as long as such materials are suitable for implementing the present invention. This is also true of the other embodiments according to the present invention.

Each of the materials of the various wire metal layers Vin, Vout, Vdd, and Vss in the first embodiment is not limited to metal, and may be a conductive material layer, such as an alloy layer or a semiconductor layer containing a large amount of acceptor or donor impurities. Such layers may be used either alone or in combination. This is also true of the other embodiments according to the present invention.

In the first embodiment, the TiN layer 211 is used as the gate conductor layer. As the TiN layer 211, it is possible to use single-layer or multilayer material layers as long as such materials are suitable for implementing the present invention. The TiN layer 211 can be formed using a single-layer or multilayer conductor layer, such as a metal layer, having at least a desired work function. It is also possible to form another conductive layer, such as a W layer, on the outer side of the TiN layer 211, for example. In such a case, the W layer serves the role of a metal wire layer for connecting the gate metal layer. Instead of the W layer, it is also possible to use other single-layer or multilayer metal layers. In addition, although the HfO$_2$ layer 20 is used as the gate insulating layer, it is also possible to use other single-layer or multilayer material layers. This is also true of the other embodiments according to the present invention.

In the first embodiment, the shape of each of the Si pillars 10$a$, 10$b$, and 10$c$ as seen in plan view is circular. In the third embodiment, the shape of each of the Si pillars 24$a$ and 24$b$ as seen in plan view is rectangular. However, the shape of each Si pillar as seen in plan view may be not only circular or rectangular, but also elliptical or U-shape. It is also possible to form Si pillars with different shapes in a mixed manner on the same P-layer substrate 1$a$. This is also true of the other embodiments according to the present invention.

The third embodiment illustrates an example in which a P-channel SGT is formed in the Si pillar 24$a$, and an N-channel SGT is formed in the Si pillar 24$b$. In contrast, it is also possible to, in forming a circuit including a plurality of Si pillars 24$a$ and 24$b$ each arranged in the X-X' direction or the Y-Y' direction as seen in plan view, form a uniform electric field distribution in an impurity region, which serves as a source or a drain, at the bottom portion of each Si pillar, and reduce fluctuation in the electrical characteristics of each SGT. This also leads to simplifying the design of the circuit including the SGTs. This is also true of the other embodiments according to the present invention.

The first embodiment illustrates an example of an inverter circuit in which the N$^+$ layer 3$aa$ and the P$^+$ layer 4$aa$ are formed on the entire bottom portions of the Si pillars 10$a$, 10$b$, and 10$c$. In contrast, in DRAM in which SGTs are used as selection transistors, for example, an N$^+$ layer or a P$^+$ layer is formed on a part of the bottom portions of Si pillars as seen in plan view. In such a case, a W layer may be selectively formed only on the exposed side face of the N$^+$ layer or the P$^+$ layer. Alternatively, it is also possible to form a W layer on a side face continuous with the bottom portion of a Si pillar, and leave portions of the W layer only on the side face of the N$^+$ layer or the P$^+$ layer while removing the other portions. This is also true of the other embodiments according to the present invention.

The present embodiment illustrates a case in which the present invention is applied to an inverter circuit including two SGTs. In contrast, the present invention is also applicable to a single SGT. The present invention is also applicable to a logic circuit including SGTs. The present invention is also applicable to a circuit, such as SRAM (static random access memory), DRAM (dynamic random access memory), MRAM (magnetic random access memory), ReRAM (resistive random access memory), or PCM (phase change memory), each including SGTs in memory cells.

Although SGTs are formed on the P-layer substrate 1 in the first embodiment, it is also possible to use an SOI (silicon on insulator) substrate instead of the P-layer substrate 1. Alternatively, a substrate of other materials may be used as long as such materials serve the role of a substrate. This is also true of the other embodiments according to the present invention.

The first embodiment illustrates SGTs having sources and drains formed using the N$^+$ layers 3$aa$ and N1 and the P$^+$ layers 4$aa$, P1, and P2 with conductivity of the same polarity at the top and bottom of the Si pillars 10$a$, 10$b$, and 10$c$. However, the present invention is also applicable to a tunnel SGT having a source and a drain with different polarities. This is also true of the other embodiments according to the present invention.

The present invention can be implemented in various embodiments and modifications without departing from the broad spirit and scope of the present invention. In addition, the foregoing embodiments only describe examples of the present invention and are not intended to limit the scope of the present invention. The foregoing examples and modified examples can be combined as appropriate. Further, even if some of the components of the foregoing embodiments are removed as needed, the resulting structure is within the technical idea of the present invention.

With the method for producing a pillar-shaped semiconductor device according to the present invention, it is possible to obtain a high-density and high-performance pillar-shaped semiconductor device.

What is claimed is:

1. A pillar-shaped semiconductor device comprising:
  a first semiconductor pillar formed to stand vertically on a horizontal substrate;
  a first gate insulating layer formed around the first semiconductor pillar;
  a first gate conductor layer formed around the first gate insulating layer;
  a first impurity region formed at a top of the first semiconductor pillar, wherein the first impurity region is doped to serve as one of a source or a drain of a first surrounding gate transistor (SGT);

a second impurity region formed at a bottom of the first semiconductor pillar, wherein the second impurity region is doped to serve as the other of the source or the drain of the first SGT;

a first material layer formed around the first semiconductor pillar and having a lower end that terminates in contact with the second impurity region; and a first conductor layer formed all around an outer periphery of the second impurity region and all around an outer periphery of the lower end of the first material layer, wherein a first contact hole for connecting the first conductor layer to a first external wire conductor layer is provided in contact with the first conductor layer.

2. The pillar-shaped semiconductor device according to claim 1, further comprising:

a second semiconductor pillar formed to stand vertically on the substrate adjacent to the first semiconductor pillar;

a second gate insulating layer formed around the second semiconductor pillar;

a second gate conductor layer formed around the second gate insulating layer;

a third impurity region formed at a top of the second semiconductor pillar, wherein the third impurity region is doped to serve as one of a source or a drain of a second SGT; and a fourth impurity region formed at a bottom of the second semiconductor pillar, wherein the fourth impurity region is doped to serve as the other of the source or the drain of the second SGT, wherein the first conductor layer is formed in contact with an entire side face of the second impurity region and an entire side face of the fourth impurity region.

3. The pillar-shaped semiconductor device according to claim 2, wherein:

the first conductor layer includes at least a third conductor layer formed all around the second impurity region, and a fourth conductor layer formed all around the fourth impurity region, and the third conductor layer and the fourth conductor layer are formed in contact with each other.

4. The pillar-shaped semiconductor device according to claim 2, further comprising a second material layer located at a position adjacent to one or both of the second impurity region and the fourth impurity region and at a position away from the first material layer, and also at a same level as the second impurity region, the fourth impurity region, and the first material layer in the vertical direction, wherein:

the first conductor layer surrounds an entire side face of the second material layer, and the first conductor layer is continuous around the second impurity region, the fourth impurity region, and the second material layer.

5. The pillar-shaped semiconductor device according to claim 4, wherein:

the first conductor layer is continuous around the second impurity region and the fourth impurity region facing each other, and a second contact hole for connecting a second external wire conductor layer to the first conductor layer is provided above the first conductor layer surrounding the second material layer as seen in plan view.

6. The pillar-shaped semiconductor device according to claim 4, further comprising, as seen in plan view, a fifth conductor layer as the first conductor layer surrounding the entire second impurity region, a sixth conductor layer as the first conductor layer surrounding the entire fourth impurity region, and a seventh conductor layer as the first conductor layer surrounding the entire second material layer, wherein:

side faces of the fifth conductor layer and the sixth conductor layer facing each other are located away from each other as seen in plan view, and the fifth conductor layer, the sixth conductor layer, and the seventh conductor layer are connected at least partially at side faces of the fifth conductor layer, the sixth conductor layer, and the seventh conductor layer facing each other as seen in plan view.

\* \* \* \* \*